(12) United States Patent
Zoellner et al.

(10) Patent No.: US 11,322,687 B2
(45) Date of Patent: *May 3, 2022

(54) CHARGE TRANSPORTING SEMI-CONDUCTING MATERIAL AND SEMI-CONDUCTING DEVICE

(71) Applicant: Novaled GmbH, Dresden (DE)

(72) Inventors: Mike Zoellner, Dresden (DE); Kay Lederer, Dresden (DE); Anton Kiriy, Dresden (DE); Volodymyr Senkovskyy, Dresden (DE); Brigitte Isabell Voit, Dresden (DE)

(73) Assignee: Novaled GMBH, Dresden (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/426,698

(22) PCT Filed: Sep. 6, 2013

(86) PCT No.: PCT/EP2013/068484
§ 371 (c)(1),
(2) Date: Mar. 6, 2015

(87) PCT Pub. No.: WO2014/037512
PCT Pub. Date: Mar. 13, 2014

(65) Prior Publication Data
US 2015/0349262 A1    Dec. 3, 2015

(30) Foreign Application Priority Data

Sep. 7, 2012 (EP) .................................. 12183578

(51) Int. Cl.
*C08G 61/10* (2006.01)
*C08G 61/12* (2006.01)
(Continued)

(52) U.S. Cl.
CPC .......... *H01L 51/0043* (2013.01); *C08G 12/28* (2013.01); *C08G 61/10* (2013.01); *C08G 61/12* (2013.01); *C08G 61/123* (2013.01); *C08G 61/124* (2013.01); *C08G 73/08* (2013.01); *C08J 3/246* (2013.01); *C08J 3/247* (2013.01); *H01B 1/12* (2013.01); *H01B 1/127* (2013.01); *H01L 51/004* (2013.01); *H01L 51/005* (2013.01); *H01L 51/0034* (2013.01); *H01L 51/0035* (2013.01); *H01L 51/0036* (2013.01);
(Continued)

(58) Field of Classification Search
CPC .......... H01B 1/12; H01B 1/121; H01B 1/124; H01B 1/125; H01B 1/127; H01B 1/128; H01B 1/20; H01B 1/24; H01L 51/0032; H01L 51/0034; H01L 51/0035; H01L 51/0036; H01L 51/0037; H01L 51/0038; H01L 51/0039; H01L 51/004; H01L 51/0041; H01L 51/0042; H01L 51/0043; H01L 51/0044; H01L 51/005; H01L 51/0051; H01L 51/0052; H01L 51/506; H01L 51/5076; C08G 61/12; C08G 61/121; C08G 61/122; C08G 61/123; C08G 61/124; C08G 61/125; C08G 61/126; C08G 61/127; C08G 61/128; C08G 12/28; C08G 73/08; C08G 79/06; C08G 2261/51; C08G 2261/612; C08G 2261/514; C08G 2261/516; C08G 2261/76; C08G 2261/79; C08G 2261/792; C08G 2261/794; C08G 2261/135; C08G 2261/143; C08G 2261/3221; C08G 2261/3162; C08G 2261/3241; C08G 61/10; C08G 2261/11; C08G 2261/12; C08G 2261/95; C08G 2261/142; C08G 2261/1422; C08G 2261/1424; C08G 2261/1426; C08G 2261/1428; C08G 2261/144; C08G 2261/146; C08G 2261/1434; C08G 2261/3142; C08G 2261/1414; C08G 2261/1412; C08J 3/24; C08J 3/246; C08J 3/247; C08J 3/248
See application file for complete search history.

(56) References Cited

U.S. PATENT DOCUMENTS 5,093,698 A    3/1992 Egusa
6,103,029 A *  8/2000 Reed, Jr. ............... C06B 45/105
                                                149/19.4
(Continued)

FOREIGN PATENT DOCUMENTS

CN    102585220 A    7/2012
EP    1912268 A1    4/2008
(Continued)

OTHER PUBLICATIONS

Bridgehead carbon. Illustrated Glossary of Organic Chemistry. (2010-2017, retrieved Feb. 10, 2017 from http://web.chem.ucla.edU/~harding/IGOC/B/bridgehead.html).*
(Continued)

*Primary Examiner* — Matthew R Diaz
(74) *Attorney, Agent, or Firm* — Eversheds Sutherland (US) LLP

(57) ABSTRACT

The present invention relates to a charge transporting semi-conducting material comprising: a) optionally at least one electrical dopant, and b) at least one cross-linked charge-transporting polymer comprising 1,2,3-triazole cross-linking units, a method for its preparation and a semiconducting device comprising the charge transporting semi-conducting material.

10 Claims, 11 Drawing Sheets

Figure 1:
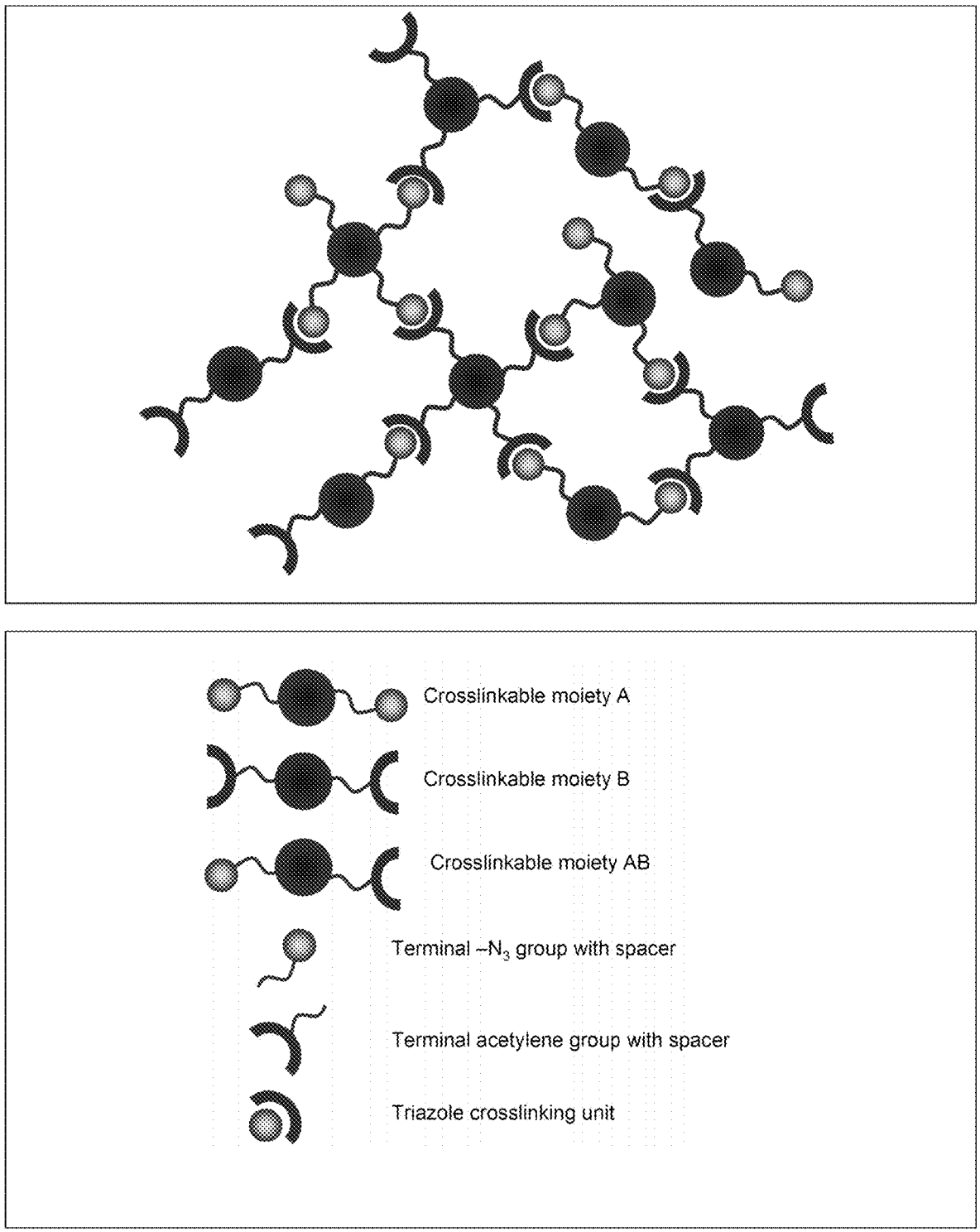

(51) Int. Cl.
  *C08J 3/24* (2006.01)
  *H01L 51/00* (2006.01)
  *H01L 51/50* (2006.01)
  *H01B 1/12* (2006.01)
  *C08G 73/08* (2006.01)
  *C08G 12/28* (2006.01)

(52) U.S. Cl.
  CPC ...... *H01L 51/0038* (2013.01); *H01L 51/0039* (2013.01); *H01L 51/0041* (2013.01); *H01L 51/0051* (2013.01); *H01L 51/0052* (2013.01); *H01L 51/0059* (2013.01); *H01L 51/0067* (2013.01); *C08G 2261/11* (2013.01); *C08G 2261/12* (2013.01); *C08G 2261/135* (2013.01); *C08G 2261/142* (2013.01); *C08G 2261/143* (2013.01); *C08G 2261/144* (2013.01); *C08G 2261/146* (2013.01); *C08G 2261/1412* (2013.01); *C08G 2261/1414* (2013.01); *C08G 2261/1422* (2013.01); *C08G 2261/1424* (2013.01); *C08G 2261/3142* (2013.01); *C08G 2261/3162* (2013.01); *C08G 2261/3221* (2013.01); *C08G 2261/3241* (2013.01); *C08G 2261/51* (2013.01); *C08G 2261/76* (2013.01); *C08G 2261/79* (2013.01); *C08G 2261/95* (2013.01); *C08J 2365/00* (2013.01); *H01L 51/506* (2013.01); *H01L 51/5076* (2013.01)

(56) References Cited

U.S. PATENT DOCUMENTS

| | | | | |
|---|---|---|---|---|
| 7,208,243 | B2* | 4/2007 | Li | C08J 5/2218 429/493 |
| 7,675,057 | B2 | 3/2010 | Drechsel et al. | |
| 7,893,160 | B2 | 2/2011 | Inbasekaran et al. | |
| 8,134,146 | B2 | 3/2012 | Limmert et al. | |
| 10,468,601 | B2* | 11/2019 | Lederer | H01L 51/0043 |
| 2006/0250076 | A1 | 11/2006 | Hofmann et al. | |
| 2007/0096082 | A1* | 5/2007 | Gaynor | C07C 211/60 257/40 |
| 2007/0225454 | A1 | 9/2007 | Lewis et al. | |
| 2007/0248839 | A1* | 10/2007 | Towns | C07F 7/0818 428/690 |
| 2008/0265216 | A1 | 10/2008 | Hartmann et al. | |
| 2009/0174311 | A1* | 7/2009 | Patel | H01L 51/0003 313/504 |
| 2010/0151319 | A1* | 6/2010 | Park | C08G 61/08 429/213 |
| 2010/0261808 | A1* | 10/2010 | Schadler | B82Y 30/00 523/205 |
| 2011/0065864 | A1* | 3/2011 | Odobel | C08F 220/12 525/55 |
| 2011/0171448 | A1* | 7/2011 | Tang | C08G 73/08 428/220 |
| 2012/0306358 | A1 | 12/2012 | Hirano et al. | |

FOREIGN PATENT DOCUMENTS

| | | | | |
|---|---|---|---|---|
| EP | 2180029 | A1 | 4/2010 | |
| JP | 2004010703 | A | 1/2004 | |
| WO | WO-9620253 | A1* | 7/1996 | ............. C08G 61/00 |
| WO | 2007/071450 | A1 | 6/2007 | |

OTHER PUBLICATIONS

Kim et al., Synthetic Metals, 112, 363-368 (Year: 2001).*
PCT International Search Report for PCT Application No. PCT/EP2013/068484 dated Jul. 10, 2014 (6 pages).
European Search Report for EP Application No. 12183578 dated Feb. 6, 2013 (10 pages).
Ameri et al., "Organic Tandem Solar Cells: A Review," Energy Environ. Sci., 2009, 2:347-363.
Bard et al., "Electrochemical Methods: Fundamentals and Applications," Wiley, 2000, 2. Edition, pp. 52-55, 239-247, and 808-815.
Durr et al., "High Molecular Weight Acrylonitrile-Butadiene Architectures via a Combination of RAFT Polymerization and Orthogonal Copper Mediated Azide-Alkyne Cycloaddition," Polym. Chem., 2012, 3:1048-1060.
Joralemon et al., "Shell Click-Crosslinked (SCC) Nanoparticles: A New Methodology for Synthesis and Orthogonal Functionalization," J. Am. Chern. Soc., 2005, 127:16892-16899.
Liao et al., "Highly Efficient Inverted Polymer Solar Cell by Low Temperature Annealing of Cs2CO3 Interlayer," Applied Physics Letters, 2008, 92:173303-1-173303-3.
Ossipov et al., "Poly(vinyl Alcohol)-Based Hydrogels Formed by 'Click Chemistry'," Macromolecules, 2006, 39:1709-1718.
Qin et al., "Click Polymerization: Progress, Challenges, and Opportunities," Macromolecules, 2010, 43:8693-8702.
Tang et al., "Organic Electroluminescent Diodes," Appl. Phys. Lett., 1987, 51(12):913-915.
Wang et al., "Hyberbranched Polytriazoles with High Molecular Compressibility: Aggregation-Induced Emission and Superamplified Explosive Detection," J. Mater. Chem., 2011, 21:4056-4059.
Wu et al., "New Hyperbranched Polytriazoles Containing Isolation Chromophore Moieties Derived from AB4 Monomers through Click Chemistry under Copper(I) Catalysis: Improved Optical Transparency and Enhanced NLO Effects," Chem. Eur. J., 2012, 18:4426-4434.
Yu et al., "p-Type Doping in Organic Light Emitting Diodes Based on Fluorinated C60," Journal of Applied Physics, 2008, 104:124505-1-124505-3.
Zuniga et al., "Approaches to Solution-Processed Multilayer Organic Light-Emitting Diodes Based on Cross-Linking," Chem. Mater., 2011, 23:658-681.
Iyoda et al., "Novel Cyclo-Oligomerization of Nickel Carbenoids: a Simple and Efficient Synthesis of Radialenes," J. Chem., Soc., Chem. Commun., 1989, 1690-1692.
Enomoto et al., "Synthesis, Structure, and Properties of Hexaaryl[3]radialenes," Bull. Chem. Soc. Jpn., 2000, 73:2109-2114.
Enomoto et al., "Hexaaryl[3]radialenes," Tetrahedron Letters, 1997, 38(15):2693-2696.
Iyoda et al., "Novel PI-Expanded Radialene Macrocyles with Inner Cavity," Organic Letters, 2004, 6(25):4667-4670.
Chinese Office Action for CN Application No. 201380046828.4 dated Nov. 28, 2016 (English translation) (16 pages).
European Office Action for EP Application No. 12 183 578.9 dated Mar. 23, 2017 (6 pages).
Japanese Office Action for JP Application No. 2015-530414 dated Aug. 1, 2017 (English translation, 5 pages).
Taiwanese Search Report for TW Application No. 102132415 dated Nov. 20, 2017 (9 pages).

* cited by examiner

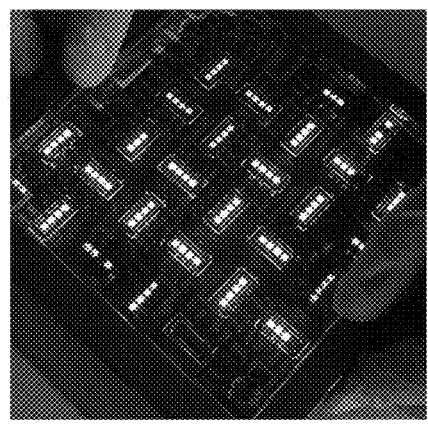
Fig. 11A
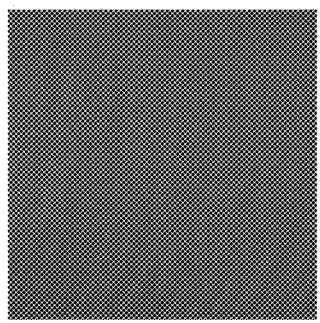
Fig. 11B
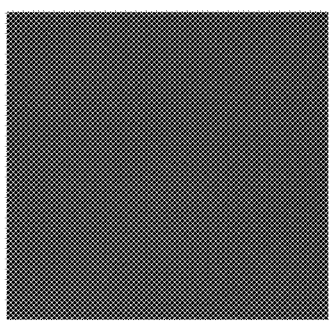
Fig. 11C
Fig. 11

CHARGE TRANSPORTING SEMI-CONDUCTING MATERIAL AND SEMI-CONDUCTING DEVICE

CROSS REFERENCE TO RELATED APPLICATIONS

This application is a U.S. national stage application of PCT/EP2013/068484, filed on Sep. 6, 2013, which claims priority to European Application No. 12183578.9, filed on Sep. 7, 2012. The contents of these applications are hereby incorporated by reference in their entirety.

The present invention relates to a charge transporting semi-conducting material, a method for its preparation and a semiconducting device comprising the material.

Since the demonstration of low operating voltages by Tang et al., 1987 [C. W. Tang et al. Appl. Phys. Lett. 51 (12) 913 (1987)], organic light-emitting diodes have been promising candidates for the realization of large-area displays. They consist of a sequence of thin (typically 1 nm to 1 µm) layers of organic materials, which can be produced by vacuum deposition, by spin-on deposition or by deposition from solution in their polymer form. After electrical contacting by metallic layers they form a great variety of electronic or optoelectronic components, such as for example diodes, light-emitting diodes, photodiodes and thin film transistors (TFT), which, in terms of properties, compete with established components based on inorganic layers.

In the case of organic light-emitting diodes (OLEDs), light is produced and emitted by the light-emitting diode by the injection of charge carriers (electrons from one side, holes from the other) from the contacts into adjacent organic layers as a result of an externally applied voltage, subsequent formation of excitons (electron-hole pairs) in an active zone, and radiant recombination of these excitons.

The advantage of such organic components as compared with conventional inorganic components (semiconductors such as silicon, gallium arsenide) is that it is possible to produce large-area elements, i.e., large display elements (visual displays, screens). Organic starting materials, as compared with inorganic materials, are relatively inexpensive (less expenditure of material and energy). Moreover, these materials, because of their low processing temperature as compared with inorganic materials, can be deposited on flexible substrates, what opens up a whole series of new applications in display and illuminating engineering.

The basic construction of such a component includes an arrangement of one or more of the following layers:
1. Carrier, substrate
2. Base electrode, hole-injecting (positive pole), usually transparent
3. Hole-injecting layer
4. Hole-transporting layer (HTL)
5. Light-emitting layer (EL)
6. Electron-transporting layer (ETL)
7. Electron-injecting layer
8. Cover electrode, usually a metal with low work function, electron-injecting (negative pole)
9. Encapsulation, to shut out ambient influences.

While the foregoing represents the most typical case, often several layers may be (with the exception of the $2^{nd}$, $5^{th}$ and $8^{th}$ layers) omitted, or else one layer may combine several properties. U.S. Pat. No. 5,093,698 discloses that the hole-conducting and/or the electron-conducting layer may be doped with other organic molecules, in order to increase their conductivity.

Organic photovoltaics (OPV) offer a big promise for the efficient and large scale conversion of light into electricity. The production of organic photovoltaic devices is less material demanding than the production of inorganic crystalline photovoltaic devices. The production also consumes considerably less energy than the production of any other inorganic photovoltaic device.

Efficiency of organic photovoltaic devices has been improving steadily. In 2008 a certified power conversion efficiency value of 5% was reached, and in 2010 the psychological barrier of 8% was broken, aligning the efficiency of the organic photovoltaic devices to typical values of amorphous Si devices.

OPV devices comprise at least one solar cell, or an arrangement of solar cells. Organic solar cells have the most different layer stack architectures. Typically they comprise at least one organic photovoltaic layer between two electrodes. That organic layer can be a blend of a donor and an acceptor such as P3HT (poly3-hexyl-tiophene) and PCBM (phenyl C61 Butyric Acid Methyl Ester). Such simple device structures only achieve reasonably efficiencies if interfacial injection layers are used to facilitate charge carrier injection/extraction (Liao et al., Appl. Phys. Lett., 2008. 92: p. 173303). Other organic solar cells have multi-layer structures, sometimes even hybrid polymer and small molecule structures. Also tandem or multi-unit stacks are known (U.S. Pat. No. 7,675,057, or Ameri, et al., Energy & Env. Science, 2009. 2: p. 347). Multi-layer devices can be easier optimized since different layers can comprise different materials which are suitable for different functions. Typical functional layers are transport layers, optically active layers, injection layers, etc.

The use of doped charge-carrier transport layers (p-doping of the HTL by admixture of acceptor-like molecules, n-doping of the ETL by admixture of donor-like molecules) is described in U.S. Pat. No. 5,093,698. Doping in this sense means that the admixture of doping substances into the layer increases the equilibrium charge-carrier concentration in this layer, compared with the pure layers of one of the two substances concerned, which results in improved conductivity and better charge-carrier injection from the adjacent contact layers into this mixed layer. The transport of charge carriers still takes place on the matrix molecules. According to U.S. Pat. No. 5,093,698, the doped layers are used as injection layers at the interface to the contact materials, the light-emitting layer being found in between (or, when only one doped layer is used, next to the other contact). Equilibrium charge-carrier density, increased by doping, and associated band bending, facilitate charge-carrier injection. The energy levels of the organic layers (HOMO=highest occupied molecular orbital or highest energetic valence band energy; LUMO=lowest unoccupied molecular orbital or lowest energetic conduction band energy), according to U.S. Pat. No. 5,093,698, should be obtained so that electrons in the ETL as well as holes in the HTL can be injected into the EL (emitting layer) without further barriers, which requires very high ionization energy of the HTL material and very low electron affinity of the ETL material.

An important property of organic semi-conducting devices is their conductivity. By electrical doping, the conductivity of a layer of an organic semi-conducting device can be significantly increased. The conductivity of a thin layer sample can be measured by, for example, the so called two-point method. At this, a voltage is applied to the thin layer and the current flowing through the layer is measured.

The resistance, respectively the conductivity, results by considering the geometry of the contacts and the thickness of the layer of the sample.

In fields of organic electronics, several different functional organic layers have to be formed on top of each other to produce an electronic device. The function of the device results from the optimized interaction of the stacked layers and their interfaces. In general, there are two different approaches for preparing these layers and interfaces. First, vacuum deposition and, second, coating of the functional material from a solution on the top of substrate or of another layer prepared before.

From these technologies, solution processes gain rising attention due to their potential for a high throughput mass production and lower costs in comparison with high vacuum technologies.

When using solution processes, there is the challenge of avoiding damage or dissolving previous organic layer or any other undesirable changes of its properties by depositing another layer on top of it from a solvent. Besides the so called "orthogonal solvent" approach, crosslinking of the previous organic layer is a possibility to prevent damaging, dissolving or changing of the layer.

There are many possible crosslinking reactions known in the art. Much of them were already used in production of organic polymeric semi-conductors. However, there is still a general problem of possible interferences of the crosslinking reaction with doping, if the crosslinked layer should serve as charge transporting layer. The use of crosslinking techniques for preparing doped organic materials is limited by the fact that crosslinking generally includes reaction of highly reactive groups or needs activation by high temperatures or high energetic irradiation. Such conditions are frequently incompatible with dopants or with the created charge carriers. This applies especially in case of electrical doping which creates rather sensitive charge carriers having ion-radical character.

An informative survey of available crosslinking methods tested in OLEDs is provided, for example, by Zuniga et al., Chem. Mater. 2011, 23, 658-681. Any of the methods known so far has its specific drawbacks and limitations. Polycondensations, e.g. widely used polysiloxane formation, generally leave potentially problem-causing byproducts like HCl. Radical polymerisations of properly activated double bonds (e.g. styrene- or acrylate-like) need activation by UV-light, by an added radical initiator, by temperatures generally significantly above 100° C., or by combination of this means. Trifluorophenylether or benzocyclobutene cycloadditions require temperatures above 200° C., chalcone or cinnamate cycloadditions need photochemical activation by absorption of UV light. Oxetane cationic polymerisations need activation by strong acids or reactive cations.

So far, very little is known about compatibility of reactive groups and crosslinking processes with electrical dopants. Successful p-doping with $C_{60}F_{36}$ in polyvinylcarbazole bearing UV-crosslinked cinnamate groups and in polytriarylamine bearing oxetane groups crosslinked by a photoacid was reported by Yu et al., J. Appl. Phys. 2008, 104, 124-505.

Therefore, it is an object of the present invention to provide a charge transporting semi-conducting material which overcomes the drawbacks of the prior art. In particular, a charge transporting semi-conducting material shall be provided which is obtainable by crosslinking under mild conditions without irradiation, additional initiators or catalysts by retaining its high conductivity during crosslinking.

This object has been achieved by a charge transporting semi-conducting material comprising:

a) optionally at least one electrical dopant, and
b) at least one cross-linked charge-transporting polymer comprising 1,2,3-triazole crosslinking units of the general formulae Ia and/or Ib,

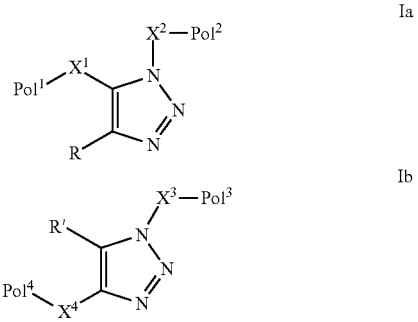

wherein
aa) $Pol^1$-$Pol^4$ are independently selected charge-transporting polymers,
bb) $X^1$, $X^2$, $X^3$, and $X^4$ are independently selected spacer units or represent direct bonding of the Pol groups to the 1,2,3-triazole ring,
cc) R and R' are independently selected from the group consisting of
   H, halogen, nitrile, $C_1$-$C_{22}$ saturated or unsaturated alkyl, $C_3$-$C_{22}$ cycloalkyl, $C_6$-$C_{18}$ aryl, $C_7$-$C_{22}$ arylalkyl,
   $C_2$-$C_{13}$ heteroaryl having up to three heteroatoms, independently selected from oxygen, nitrogen and sulphur,
   $SiR^1R^2R^3$, wherein $R^1$, $R^2$ and $R^3$ are independently selected from $C_1$-$C_4$ alkyl or phenyl,
   $COR^4$ or $COOR^5$, wherein $R^4$ and $R^5$ are independently selected from $C_1$-$C_{22}$ alkyl or $C_7$-$C_{22}$ arylalkyl,
   $CR^6R^7OR^8$, wherein $R^6$ and $R^7$ are independently selected from H, $C_1$-$C_6$ alkyl, $C_6$-$C_9$ aryl or $R^6$ and $R^7$ together form a $C_3$-$C_7$ ring, and $R^8$ is $C_1$-$C_6$ alkyl, $C_7$-$C_{22}$ arylalkyl, $SiR^9R^{10}R^{11}$, wherein $R^9$, $R^{10}$, and $R^{11}$ are independently selected from $C_1$-$C_4$ alkyl or phenyl, or $COR^{12}$, wherein $R^{12}$ is H or $C_1$-$C_{21}$ alkyl,
   wherein the groups from which R and R' can be selected can be optionally substituted by alkyl, cycloalkyl, aryl, heteroaryl or arylalkyl, in which the number of C-atoms, stated under cc), includes the number of C-atoms of the substituents, and, in case that R and R' are selected from alkyl, cycloalkyl, aryl, heteroaryl or arylalkyl, the group can be optionally partially or fully substituted by halogen atoms;
the charge transporting semi-conducting material being obtainable by a process comprising:
i) providing a solution containing
   aaa) a first precursor charge transporting polymer comprising at least one covalently attached azide group and optionally at least one acetylenic group; and/or a second precursor charge transporting polymer comprising at least one covalently attached acetylenic group and optionally at least one azide group; and optionally at least one crosslinking agent comprising at least two functional groups selected from azide and/or acetylenic group,
   bbb) optionally at least one electrical dopant,
   ccc) at least one solvent, ii) depositing the solution on a substrate,
iii) removing the solvent, and
iv) reacting the azide and acetylenic groups to effect crosslinking, preferably by heating,
wherein the average number of azide and/or acetylenic groups per molecule in each the first precursor charge transporting polymer, the second precursor charge transporting polymer and the crosslinking agent is greater than 2, preferably greater than 2.05.

An electrical dopant is being understood as a compound introduced in a semi-conductor for the purpose of modulating its electrical properties, preferably for increasing its conductivity. Preferably, the electrical dopant is a redox dopant which creates in the doped semiconducting material free charge carrier having character of ion radicals (holes) by means of redox reaction (charge transfer) with the charge transporting matrix. In the preferred case that the dopant is a redox p-dopant, the charge carrier has character of a cation radical (hole) and charge carrier transport is hole transport.

The strength of redox dopants can be compared e.g. in terms of their electrochemical redox potential, which can be measured by cyclic voltammetry in presence of a reference redox system, for example Fc/Fc'. Details of cyclovoltammetry and other methods to determine reduction potentials and the relation of the ferrocene/ferrocenium reference couple to various reference electrodes can be found in A. J. Bard et al., "Electrochemical Methods: Fundamentals and Applications", Wiley, 2. Edition, 2000.

A spacer unit in terms of the present invention is a structural moiety allowing connection of two molecular groups, preferably via covalent bonding. In general, any covalent structure, stable enough to withstand conditions of crosslinking process, can be used as a spacer unit. The term "structural moiety" is used for any part of a more complex chemical structure.

Preferably, spacer units having up to 30 multivalent atoms can be used. Even more preferred, the spacer unit is a molecular group only comprising covalent bonds. The spacer having up to 30 multivalent atoms does not need to contribute itself to the charge-transporting properties of the charge transporting semi-conducting material. Spacer units comprising more than 30 multivalent atoms can be preferably used, in case that the spacer unit comprises a system of conjugated π orbitals to allow charge transfer along the spacer unit. In this case, the spacer unit can basically work in the doped semiconducting material of the invention not only in the role of a tether linking the charge transporting polymer Pol with the triazole crosslinking unit, but, at once, together with Pol in the role of a charge transporting matrix without any substantial limitation in the spacer length. Multivalent in this regard means a valence higher than one. Hydrogen and alkaline metals are regarded as every time monovalent, the valence of other elements depends on their bonding in the spacer in each specific case.

The overall amount of the spacer unit in the charge transporting semi-conducting material should not exceed 90% by weight, preferably 80% by weight, most preferably 50% by weight, with regard to the overall weight of the charge transporting semi-conducting material.

Saturated alkyl comprises all linear and branched alkyl groups, only containing carbon-carbon single bonds. Unsaturated alkyl is a linear or branched hydrocarbon group comprising at least one carbon-carbon double bond.

Cycloalkyl in terms of the present invention includes all cyclic and polycyclic carbon structures, which can optionally also contain unsaturated bonds with exception of aromatic systems (aryls).

The term aryl includes also aryl groups substituted by alkyl groups, like tolyl, xylyl, etc. It further includes all kind of condensed aromatic systems like naphthyl, antracene-yl, phenanthrene-yl and aryl substituted aryls like 1,1'-biphenyl-4-yl.

Halogen means F, Cl, Br and I.

Cross-linking in terms of the present invention means to link polymer chains to form an infinite structure, preferably by new covalent bonds forming new (crosslinking) structural moieties (crosslinking units). Basically, it is necessary to have at least two crosslinkable reactive groups per molecule in the crosslinking reaction mixture, to be able to achieve a continuous infinite network during crosslinking reaction from starting molecules linked together with new crosslinking units formed from the starting crosslinkable reactive groups. The term "infinite" means that the network forms a huge polymer molecule which size is only limited by the total amount of precursor materials. The higher the average number of the reactive groups per molecule is, the lower is the conversion of functional groups to crosslinking groups, needed to form the infinite network (gelation point). A person skilled in the art will be aware that an increased number of cross-linking units in the cross-linked charge transporting material can be particularly advantageous to achieve a layer of high stability, especially of high resistance against damage by any solvent used in processing of an adjacent layer.

In the crosslinked charge transporting polymer according to the invention, binding of each crosslinking triazole unit can be to the same molecule or to different molecules of the charge transporting polymer Pol. Each Pol molecule is bound at least to one triazole crosslinking unit. If the crosslinked charge transporting polymer according to the invention forms an infinite structure, the average number of the Pol molecules linked directly or through the spacer to one crosslinking triazole group as well as the average number of the crosslinking triazole groups connected directly or through the spacer to one Pol molecule is higher than two.

A charge transporting polymer in terms of the present invention is a polymer capable to transport an injected charge owing to a system of overlapping orbitals along the polymer. The overlapping orbitals are preferably orbitals of atoms in the polymer backbone, but can also be orbitals of the atoms contained in the pending side groups along the polymeric backbone. Injecting charge (either in form of electron injected or withdrawn by an electrode in contact with the polymer or through a reaction with a proper electrical dopant) can, thus, form a delocalized cation radical or anion radical, able to easily migrate through the polymeric material and thus create measurable currents if an electric voltage is applied.

Preferably, the charge transporting semi-conducting material has an electric conductivity higher than $10^{-10}$ S/cm, preferably higher than $10^{-8}$ S/cm, more preferably higher than $10^{-6}$ S/cm, most preferably higher than $10^{-4}$ S/cm.

The crosslinked charge transporting polymer of the general formulae Ia and/or Ib is obtainable by a process comprising cycloaddition reaction of azide groups —$N_3$ comprised and covalently bound in crosslinkable moieties A and complementary acetylenic groups —CC—R or —CC—R', where R and R' is as defined above, comprised and covalently bound in complementary crosslinkable moieties B.

In a preferred embodiment of the invention, at least crosslinkable moieties A or at least crosslinkable moieties B have character of a precursor charge transporting polymer. Precursor charge transporting polymer is a charge transporting polymer comprising crosslinkable azide and/or acetylenic groups. The precursor charge transporting polymer may be linear or branched, but may not be crosslinked, because crosslinking would have made it insoluble.

It is preferred that at least one precursor charge transporting polymer is comprised in the mixture according to feature aaa) of the inventive charge transporting semiconducting material.

In a preferred embodiment, the first precursor charge transporting polymer comprises at least one of the building units IIa, IIb, IIc and/or IIe, and/or the second precursor charge transporting polymer comprises at least one of the building units IIa', IIb', IIc' and/or IIe'

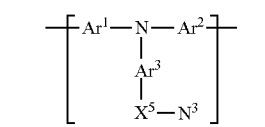
IIa

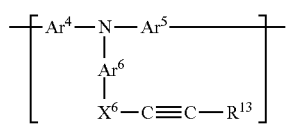
IIa'

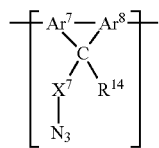
IIb

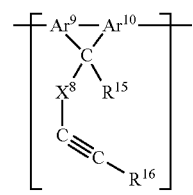
IIb'

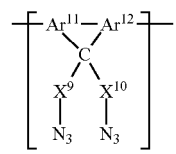
IIc

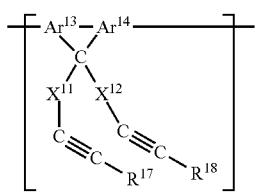
IIc'

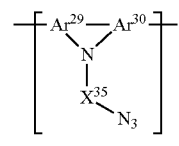
IIe

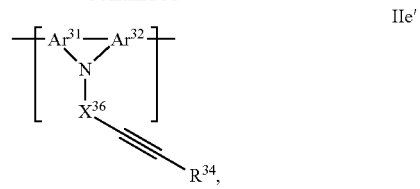
IIe' wherein $Ar^1$-$Ar^{14}$ and $Ar^{29}$-$Ar^{32}$ are independently selected from $C_6$-$C_{18}$ arylene, optionally substituted by alkyl or cycloalkyl groups, which can be optionally partially or fully substituted by halogen atoms, wherein the stated number of C-atoms includes the number of the C-atoms of the substituents, and wherein in case of $Ar^7$-$Ar^{14}$ and $Ar^{29}$-$Ar^{32}$ the arylene group is an ortho-arylene group forming with the second arylene and with the ring aliphatic carbon atom or nitrogen atom of the same structural unit a five membered ring, and binding to any adjacent structural unit of the polymer can be achieved from any other of the possible position of the arylene group, $X^5$-$X^{12}$ and $X^{35}$-$X^{36}$ are independently selected spacer units or represent direct bonding, $R^{13}$, $R^{16}$-$R^{18}$ and $R^{34}$ are independently selected from the group consisting of H, halogen, nitrile, $C_1$-$C_{22}$ saturated or unsaturated alkyl, $C_3$-$C_{22}$ cycloalkyl, $C_6$-$C_{18}$ aryl, $C_7$-$C_{22}$ arylalkyl, $C_2$-$C_{13}$ heteroaryl having up to three heteroatoms, independently selected from oxygen, nitrogen and sulphur, $SiR^1R^2R^3$, wherein $R^1$, $R^2$ and $R^3$ are independently selected from $C_1$-$C_4$ alkyl or phenyl, $COR^4$ or $COOR^5$, wherein $R^4$ and $R^5$ are independently selected from $C_1$-$C_{22}$ alkyl or $C_7$-$C_{22}$ arylalkyl, $CR^6R^7OR^8$, wherein $R^6$ and $R^7$ are independently selected from H, $C_1$-$C_6$ alkyl, $C_6$-$C_9$ aryl or $R^6$ and $R^7$ together form a $C_3$-$C_7$ ring, and $R^8$ is $C_1$-$C_6$ alkyl, $C_7$-$C_{22}$ arylalkyl, $SiR^9R^{10}R^{11}$, wherein $R^9$, $R^{10}$, and $R^{11}$ are independently selected from $C_1$-$C_4$ alkyl or phenyl, or $COR^{12}$, wherein $R^{12}$ is H or $C_1$-$C_{21}$ alkyl, wherein the groups from which R and R' can be selected can be optionally substituted by alkyl, cycloalkyl, aryl, heteroaryl or arylalkyl, in which the number of C-atoms, stated under cc), includes the number of C-atoms of the substituents, and, in case that R and R' are selected from alkyl, cycloalkyl, aryl, heteroaryl or arylalkyl, the group can be optionally partially or fully substituted by halogen atoms;

and $R^{14}$-$R^{15}$ are independently selected from H, $C_1$-$C_{22}$ alkyl, $C_3$-$C_{22}$ cycloalkyl, $C_6$-$C_{25}$ aryl, $C_7$-$C_{22}$ arylalkyl, $C_1$-$C_{20}$ alkoxy, $C_6$-$C_{18}$ aryloxy, $C_1$-$C_{20}$ alkylthio, $C_6$-$C_{18}$ arylthio, $C_{12}$-$C_{24}$ diarylamino, and $C_2$-$C_{13}$ heteroaryl having up to three hetero atoms, independently selected from oxygen, nitrogen and sulphur, wherein, in case that any of $R^{14}$-$R^{15}$ are selected from alkyl, arylalkyl, aryl, cycloalkyl or heteroaryl, the groups can be optionally substituted by alkyl, cycloalkyl, aryl, heteroaryl, arylalkyl, wherein the stated number of C-atoms includes the number of C-atoms of the substituents, and the groups can be optionally partially or fully substituted by halogen atoms.

Ortho-arylene in this regard relates to binding to the respective arylene group at two vicinal carbon atoms of the arylene group, for example at 1 and 2 position of a benzene ring.

A building unit in terms of the present invention is a structural unit repeating in the polymer chain. Any polymer chain can be formally obtained by linking its building units together successively, like the beads of a necklace.

The building units can be the same or different and can be present in the polymer in random or regular order as well as in blocks, containing a variety of the same building units.

In a further preferred embodiment, the first precursor charge transporting polymer comprises at least one of the building units selected from IIa, IIc and IIe and/or the second charge transporting polymer comprises at least one building unit selected from IIa', IIc' and IIe', wherein $Ar^1$-$Ar^6$ are 1,4-phenylene, $X^5$, $X^6$, $X^9$-$X^{12}$ and $X^{35}$-$X^{38}$ are independently selected from $C_1$-$C_{10}$ alkane-α,ω-diyl bridge, in which connection with the arylene group or to the ring aliphatic carbon atom of the five membered ring is made either directly or by means of an ether bridge, $R^{38}$ has the same definition as $R^{34}$ and IIc is IId, IIc' is IId', IIe is IIf and IIe' is IIf',

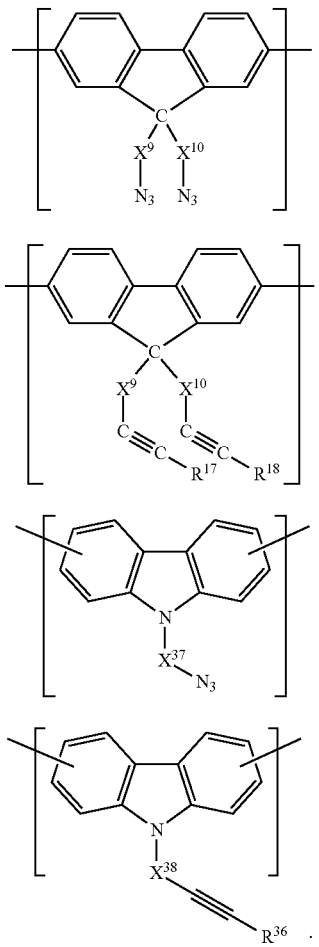

In a further preferred embodiment, the first precursor charge transporting polymer and/or the second precursor charge transporting polymer further comprise structural units of the general formula III, IV and/or VI

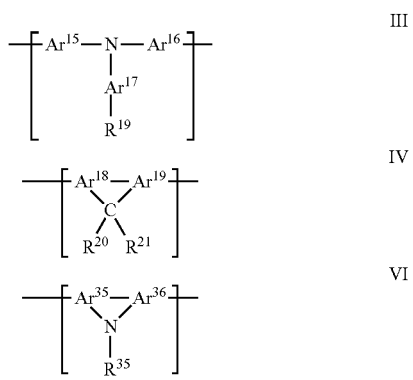

wherein $Ar^{15}$-$Ar^{19}$ and $Ar^{35}$-$Ar^{36}$ are independently selected from $C_6$-$C_{18}$ arylene, optionally substituted by alkyl or cycloalkyl groups, which can be optionally partially or fully substituted by halogen atoms, wherein the stated number of C-atoms includes the number of the C-atoms of the substituents, and wherein in case of $Ar^{18}$-$Ar^{19}$ and $Ar^{35}$-$Ar^{36}$ the arylene group is an ortho-arylene group forming with the second arylene and with the ring aliphatic carbon atom or nitrogen atom of the same structural unit a five membered ring and binding to any adjacent structural unit of the polymer can be achieved from any other of possible position of the arylene group, $R^{19}$-$R^{21}$ are independently selected from the groups as defined for $R^{14}$-$R^{15}$ above and $R^{35}$ is selected from H, $C_1$-$C_{22}$ alkyl, $C_3$-$C_{22}$ cycloalkyl, $C_6$-$C_{25}$ aryl, $C_7$-$C_{22}$ arylalkyl and $C_2$-$C_{13}$ heteroaryl having up to three hetero atoms, independently selected from oxygen, nitrogen and sulphur, wherein the $C_1$-$C_{22}$ alkyl, $C_3$-$C_{22}$ cycloalkyl, $C_6$-$C_{25}$ aryl, $C_7$-$C_{22}$ arylalkyl and $C_2$-$C_{13}$ heteroaryl can be optionally substituted by alkyl, cycloalkyl, aryl, heteroaryl, arylalkyl, with a proviso that the stated number of C-atoms includes the number of C-atoms of the substituents, and the groups can be optionally partially or fully substituted by halogen atoms.

In yet another preferred embodiment, $Ar^{15}$-$Ar^{17}$ are 1,4-phenylene,

IV is IVa

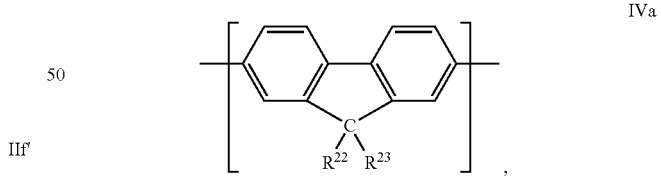

$R^{19}$, $R^{22}$ and $R^{23}$ are independently selected from $C_1$-$C_{10}$ alkyl, and $R^{19}$ can be optionally bound to $Ar^{17}$ by means of an ether bridge.

Referring to the above formulae, it is preferred that $X^5$, $X^7$, $X^9$ and $X^{10}$ are preferably —$(CH_2)_4$—, $X^6$, $X^8$, $X^{11}$ and $X^{12}$ are preferably —$OCH_2$—, $R^{19}$ is preferably 1-methylpropyl and $R^{22}$ and $R^{23}$ are preferably 1-ethylpentyl.

It is further preferred that at least one of the complementary crosslinkable moieties A and B is at least partly represented by a compound having its average functionality, defined as the average number of reactive azide and/or alkylene crosslinkable groups per a molecule, selected from 2, 3 or 4. In this embodiment, the crosslinkable moiety can be polymer, e.g. a linear polymer having reactive azide or acetylene end groups, or a three- or four-arm-star polymer having one azide or acetylenic reactive end group at the end of each arm. Of course, if one of the complementary crosslinkable moieties A and B has the average functionality 2, then the average functionality of the complementary component must be higher than 2 to make crosslinking of such mixture theoretically possible. In fact, it is practically unavoidable that some divalent crosslinkable moieties form by reaction with their complementary multivalent counterparts cyclic or macrocyclic structures. It can generally result in terminating the chain of crosslinked moieties started on the surface of the sample before reaching the opposite side. That means, if one crosslinkable moiety has its average functionality exactly equal two and the average functionality of the complementary crosslinkable moiety is higher than two, it is practically still not sufficient for gelation of such mixture. It is therefore necessary that both complementary crosslinkable moieties have their average functionalities higher than two. In a preferred embodiment, both complementary crosslinkable moieties have their average functionalities higher than 2.05, more preferably, higher than 2.1.

On the other hand, it is obvious that if average functionality of any of the crosslinkable components A and B is higher than 2, not all available reactive azide and acetylene groups must necessarily convert into crosslinking triazole groups for achieving the desired infinite crosslinked network.

It is preferred that the degree of polymerization (defined as the average number of structural units in a polymer chain) of the charge transporting precursor polymer is in the range 10-10,000, more preferably in the range 100-1,000.

Preferred combinations of building units in the precursor charge transporting polymer are A and C, A and D, A and E, B and C, B and D, B and E, A and C and D, B and C and D, A and D and E, B and D and E, wherein type A building units are selected from structures IIa, IIb, IIc and IIe, type B building units are selected from structures IIa', IIb', IIc' and IIe', type C building units are structures III, type D building units are structures of formula IV and type E building units are structures of formula VI.

In a further preferred embodiment, the crosslinking agent is selected from Va, Vb, Vc, Va', Vb' and Vc'

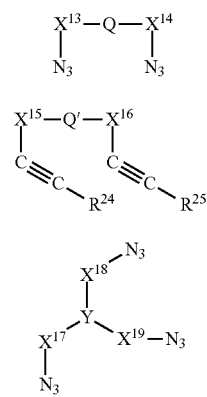

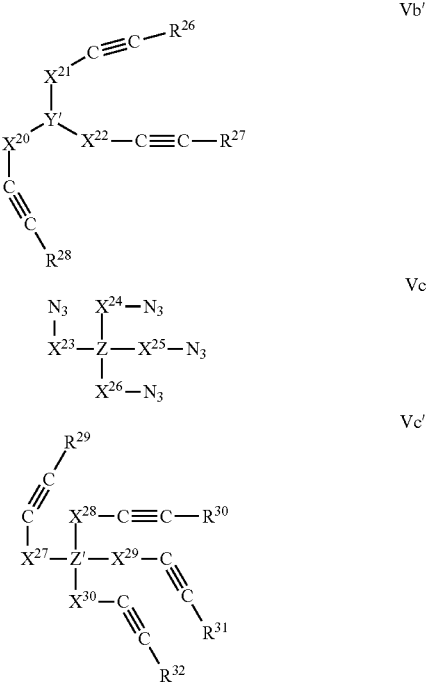

wherein Q or Q' is a divalent unit, Y or Y' is a trivalent and Z or Z' is a tetravalent unit, $X^{13}$-$X^{30}$ are independently selected covalent spacer units or represent direct bonding, and $R^{24}$-$R^{32}$ are independently selected from the groups as defined for R or R' in claim 1.

A tetravalent unit is a molecular unit or atom, capable to build four stable covalent bonds. In the same way, a di-respectively trivalent unit is a unit able to form two, respectively three, stable covalent bonds.

Preferably, Q and Q' are divalent atoms or divalent $C_6$-$C_{18}$ arene units, Y and Y' are trivalent atoms or trivalent $C_6$-$C_{18}$ arene units and Z and Z' are tetravalent atoms or tetravalent $C_6$-$C_{18}$ arene units wherein the arene units are optionally substituted by alkyl or cycloalkyl, the stated number of C-atoms includes the number of C-atoms of the substituents and the arene unit as well as the substituents can optionally, partially or fully, be substituted by halogen atoms.

Even more preferred, $X^{13}$-$X^{30}$ are independently selected from $C_1$-$C_{10}$ alkane-α,ω-diyl, wherein at least one methylene group can be optionally replaced by an oxygen atom, provided that the oxygen atom is separated from the respective azide or acetylenic group by at least two carbon atoms and, in case that Q or Q' is a divalent chalcogen atom or Y or Y' is trivalent nitrogen, the oxygen atom is not directly bound to the respective central atom.

Further preferred, Q and Q' are independently selected from the group consisting of O, S, Se, and Te, Y and Y' are independently selected from B, N, P, As and Sb, and Z and Z' are independently selected from C and Si.

Preferably, $R^{24}$-$R^{32}$ is H, Q' is a divalent benzene unit, Y' is a tetravalent benzene unit, Z is a tetravalent benzene unit, and $X^{13}$—$X^{30}$ are independently selected from $COOCH_2$, OCO, $(CH_2)_m$ or $O(CH_2)_m$, wherein m is an integer from 1-3.

Once prepared, the crosslinked charge transporting polymer is comprised in the charge transporting semiconducting material in form of a continuous polymeric network.

The crosslinked charge transporting polymer formed from previously described preferable precursor polymers comprises at least one of the structural units a) IIa″, IIb″, IIc″ and/or IIe″,

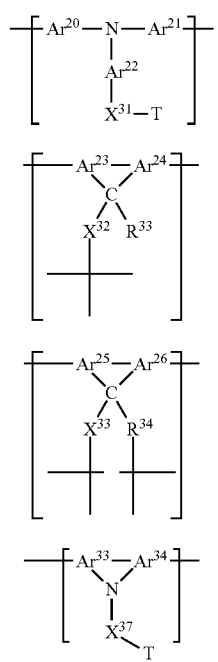

IIa″

IIb″

IIc″

IIe″ b) optionally III, IV and/or VI

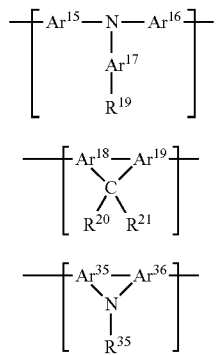

III

IV

VI wherein $Ar^{15}$-$Ar^{26}$ and $Ar^{33}$-$Ar^{36}$ are independently selected from $C_6$-$C_{18}$ arylene, optionally substituted by alkyl or cycloalkyl groups, which can be optionally partially or fully substituted by halogen atoms, wherein the stated number of C-atoms includes the number of the C-atoms of the substituents, and wherein in case of $Ar^{18}$-$Ar^{26}$ and $Ar^{33}$-$Ar^{36}$ the arylene group is an ortho-arylene group forming with the second arylene and with the ring aliphatic carbon atom or nitrogen atom of the same building unit a cyclopentadiene ring and binding to the adjacent building unit can be achieved from any other of the possible position of the arylene group, $X^{31}$, $X^{32}$, $X^{33}$, $X^{34}$ and $X^{37}$ are independently selected spacer units or represent direct bonding of the Pol groups to the 1,2,3-triazole ring, $R^{33}$ is independently selected from H, $C_1$-$C_{22}$ alkyl, $C_3$-$C_{22}$ cycloalkyl, $C_6$-$C_{25}$ aryl, $C_7$-$C_{22}$ arylalkyl, $C_1$-$C_{20}$ alkoxy, $C_6$-$C_{18}$ aryloxy, $C_1$-$C_{20}$ alkylthio, $C_6$-$C_{18}$ arylthio, $C_{12}$-$C_{24}$ diarylamino, and $C_2$-$C_{13}$ heteroaryl having up to three hetero atoms, independently selected from oxygen, nitrogen and sulphur, wherein, in case that $R^{33}$ is selected from alkyl, arylalkyl, aryl, cycloalkyl or heteroaryl, the groups can be optionally substituted by alkyl, cycloalkyl, aryl, heteroaryl, arylalkyl, wherein the stated number of C-atoms includes the number of C-atoms of the substituents, and the groups can be optionally partially or fully be substituted by halogen atoms, $R^{19}$-$R^{21}$ and $R^{35}$ are as defined above and T represents the 1,2,3-triazole ring of one of triazole cross-linking units Ia and Ib, in which binding to the triazole ring can be either to the nitrogen atom or to the carbon atom.

In a further preferred embodiment, the crosslinked charge transporting polymer can comprise the structural units IIa″, IIb″, IIc″ and/or IId″ and, optionally, III″ and/or IV″ as defined above, wherein $Ar^{15}$, $Ar^{16}$, $Ar^{17}$, $Ar^{20}$, $Ar^{21}$ and $Ar^{22}$ are 1,4-phenylene, $X^{31}$-$X^{34}$ and $X^{37}$ are independently selected from $C_1$-$C_{10}$ alkane-α,ω-diyl bridge, wherein connection to the arylene group or to the ring aliphatic carbon atom of the five membered ring is made either directly or through an additional oxygen atom, and IIc″ is IId″ and IIe″ is IIf″

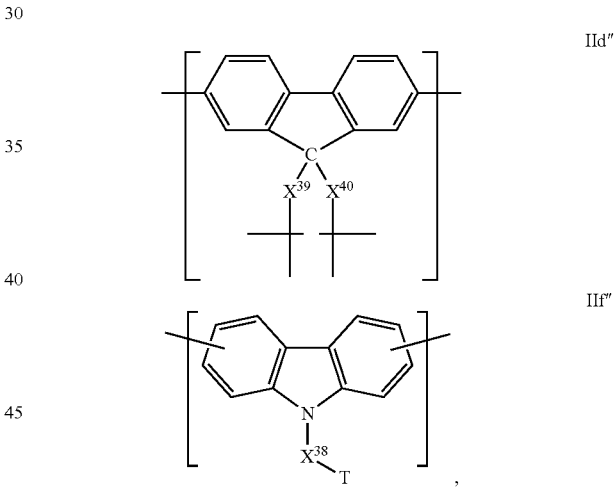

IId″

IIf″ wherein $X^{39}$-$X^{40}$ have the same definition as $X^{33}$-$X^{34}$, $X^{38}$ has the same definition as $X^{37}$ and T is as defied above.

In this connection, $X^{31}$—$X^{34}$ are preferably —OCH$_2$, in case that X is bound to the carbon atom of the triazole ring, or —(CH$_2$)—$_4$, in case that X is bound to the nitrogen atom of the triazole ring.

In a further preferred embodiment, $Ar^{15}$, $Ar^{16}$, $Ar^{17}$, $Ar^{20}$, $Ar^{21}$ and $Ar^{22}$ are 1,4-phenylene, the structural unit IV is building unit IVa, wherein $R^{22}$ and $R^{23}$ are independently selected $C_1$-$C_{10}$ alkyl, and $R^{19}$ can be optionally bound to $Ar^{17}$ by means of an additional oxygen atom.

In this connection, $R^{19}$ is preferably 1-methylpropyl and $R^{22}$ and $R^{23}$ are preferably 1-ethylpentyl.

In a crosslinked polymer formed from the preferred charge transporting polymers, there can be various amounts of structural units containing unreacted crosslinkable azide and acetylenic groups, represented by unchanged building units IIa, IIb, IIc, IIe or IIa', IIb', IIc', IId' of the corresponding precursor charge transporting polymer.

It is clear that if any compound of formulae Va, Va', Vb, Vb', Vc, Vc' is used in the preparation of crosslinked charge transporting polymer according to the invention, the reacted reactive groups of this starting "low-molecular crosslinker" become part of 1,2,3-triazole crosslinking groups and the rest of the molecule becomes part of the spacer in corresponding formula Ia or Ib. Similarly, the structure of building units of precursor polymers will be retained in corresponding structural units of the crosslinked polymer, only with proviso that reacted azide and acetylenic group will be changed into triazole crosslinking unit. More specifically, the structure of any of formulae IIa, IIa', IIb, IIb', IIc, IIc', IId, IId', IIe, IIe', III, IV, VI will be retained in corresponding structural units IIa", IIb", IIc", IId", IIe", III, IV, VI of the corresponding crosslinked polymer, only the azide and acetylene groups which reacted with their complementary group change into the corresponding 1,2,3-triazole crosslinking groups.

Thus, the crosslinker Va, if once bound in the crosslinked polymer, will form structural units Va"1

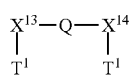

wherein $X^{13}$, $X^{14}$ and Q have the same meaning as in formula Va, at least one of $T^1$ is T as defined above, whereas the other $T^1$ is either T or an unreacted azide group.

Similarly, the crosslinker Va', if once bound in the crosslinked polymer, will form structural units Va"2

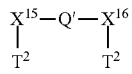

wherein $X^{15}$, $X^{16}$ and Q' have the same meaning as in formula Va', $T^2$ is either T or an unreacted acetylenic group —CC—$R^{24}$ and $T^3$ is either T or an unreacted acetylenic group —CC—$R^{25}$ as defined above, with a proviso that at least one of $T^2$ and $T^3$ is T.

The crosslinker Vb, if once bound in the crosslinked polymer, will form structural units Vb"1

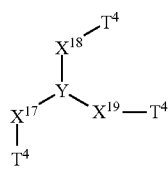

wherein $X^{17}$, $X^{18}$, $X^{19}$ and Y have the same meaning as in formula Vb, at least one of $T^4$ is T as defined above, whereas the other $T^4$ are independently either T or an unreacted azide group.

The crosslinker Vb', if once bound in the crosslinked polymer, will form structural units Vb"2

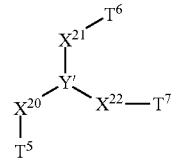

wherein $X^{20}$, $X^{21}$, $X^{22}$ and Y' have the same meaning as in formula Vb', $T^5$ is either T or an unreacted acetylenic group —CC—$R^{28}$, $T^6$ is either T or an unreacted acetylenic group —CC—$R^{26}$ and $T^7$ is either T or an unreacted acetylenic group —CC—$R^{27}$ as defined above, with a proviso that at least one of $T^5$, $T^6$ and $T^7$ is T.

The crosslinker Vc, if once bound in the crosslinked polymer, will form structural units Vc"1

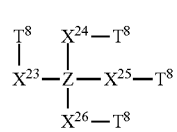

wherein $X^{23}$, $X^{24}$, $X^{25}$, $X^{26}$ and Z have the same meaning as in formula Vc, at least one of $T^8$ is T as defined above, whereas the other $T^8$ are independently either T or an unreacted azide group.

The crosslinker Vc', if once bound in the crosslinked polymer, will form structural units Vc"2

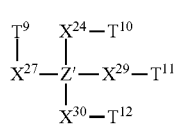

wherein $X^{27}$, $X^{28}$, $X^{29}$, $X^{30}$ and Z' have the same meaning as in formula Vc', $T^9$ is either T or an unreacted acetylenic group —CC—$R^{29}$, $T^{10}$ is either T or an unreacted acetylenic group —CC—$R^{30}$, $T^{11}$ is either T or an unreacted acetylenic group —CC—$R^{31}$ and $T^{12}$ is either T or an unreacted acetylenic group —CC—$R^{32}$ as defined above, with a proviso that at least one of $T^9$, $T^{10}$, $T^{11}$ and $T^{12}$ is T.

In case of redox p-doping, the conductivity is provided as a result of electron transfer from HOMO of the host (hole transporting material) to the LUMO of the dopant. A suitable electrical p-dopant is generally a molecule or radical with a LUMO level equal to HOMO of the host or below it. In some cases, electrical p-dopants having LUMO level slightly above the HOMO level of the host are also applicable, but the difference of frontier orbital energies in these cases should not be higher than 0.5 eV, preferably not higher than 0.3 eV. The dopant can be neutral or electrically charged.

One class of preferred p-dopants are hexaazatriphenylene compounds. A very desirable compound for use in the p-doped organic semiconducting materials is HAT-1.

HAT-1

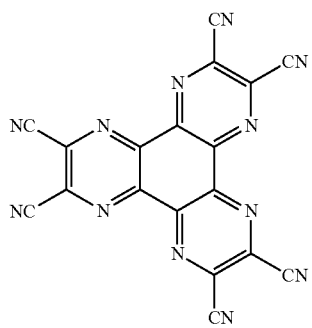

Another suitable class of preferred p-dopants are fluorinated derivatives of cyanobenzoquinonedimethanes and cyanobenzoquinonediimines such as those described in EP1912268, WO2007/071450 and US20060250076. Specific examples of fluorinated derivatives of cyanobenzoquinonedimethanes and cyanobenzoquinonediimines include:

TCNQ-1

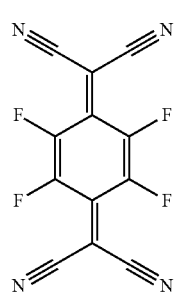

TCNQ-2

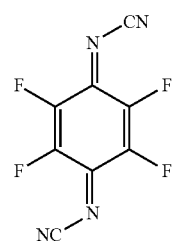

TCNQ-3

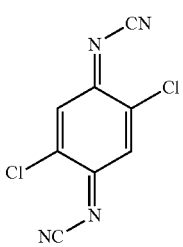

TCNQ-4

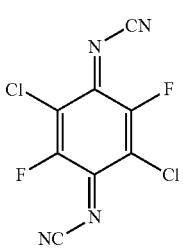

TCNQ-5

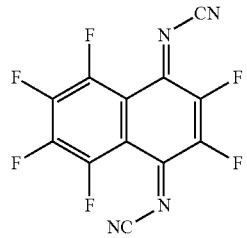

TCNQ-6

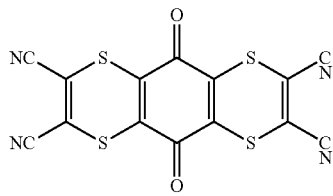

TCNQ-7

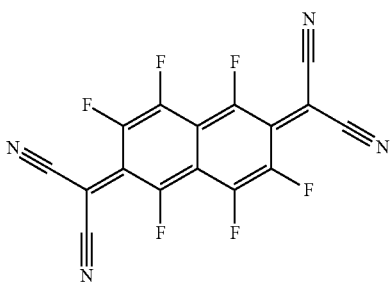

TCNQ-8

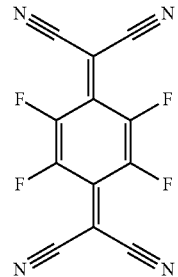

TCNQ-9

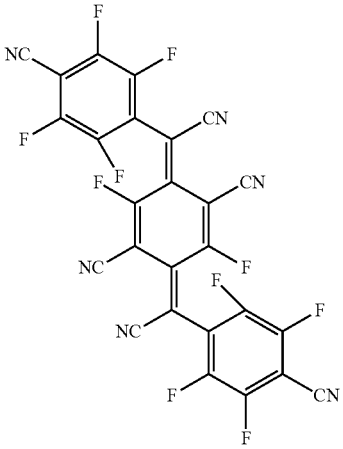

Yet another class of preferred p-dopants are radialenes such as those described in US20080265216, Iyoda et al, Organic Letters, 6(25), 4667-4670 (2004), JP3960131, Enomoto et al, Bull. Chem. Soc. Jap., 73(9), 2109-2114 (2000), Enomoto et al, Tet. Let., 38(15), 2693-2696 (1997) and Iyoda et al, JCS, Chem. Comm., (21), 1690-1692 (1989).

More preferably, the electrical dopant is selected from [3]-radialene compounds, wherein each bridgehead carbon atom is substituted by a nitrile group, $C_6$-$C_{14}$ perfluorinated aryl or $C_2$-$C_{14}$ perfluorinated heteroaryl, wherein up to three fluorine atoms in the perfluorinated substituents may optionally be replaced by groups independently selected from nitrile or trifluoromethyl.

Some illustrative examples of preferred [3]-radialenes include:

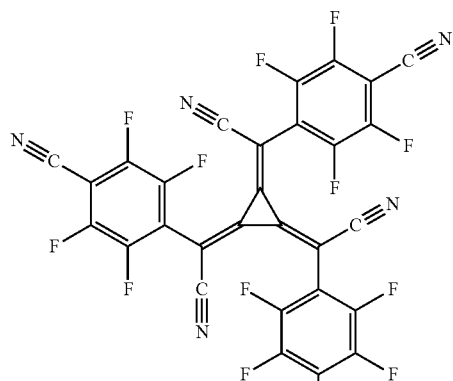

PR-1

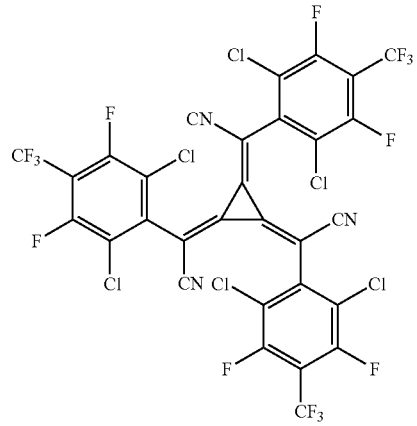

PR-2

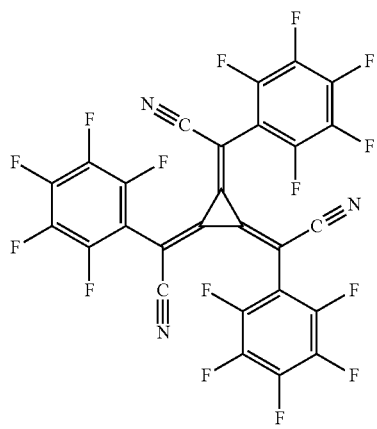

PR-3

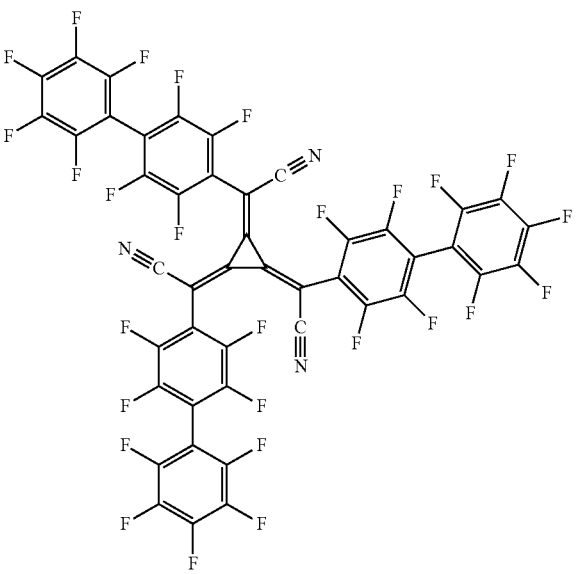

PR-4

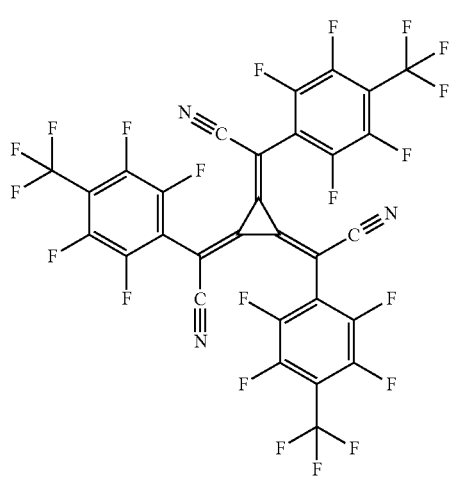

PR-5

Another class of suitable dopants represent complexes of metals having high oxidation state, e.g.:

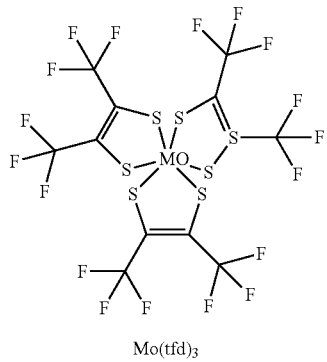

Mo(tfd)$_3$

The object is further achieved by an inventive first precursor charge transporting polymer comprising at least one covalently attached azide group and optionally at least one acetylenic group, as defined above.

Moreover, the object is achieved by an inventive second precursor charge transporting polymer comprising at least one covalently attached acetylenic group and optionally at least one azide group, as defined above.

Furthermore, the object is achieved by an inventive cross-linked charge transporting polymer, as defined above.

The object is further achieved by a process for preparing an inventive charge transporting semi-conducting material comprising:

i) providing a solution containing
   a) a first precursor charge-transporting polymer comprising at least one covalently attached azide group and optionally at least one acetylenic group; and/or a second precursor charge-transporting polymer comprising at least one covalently attached acetylenic group and optionally one azide group; and optionally at least one crosslinking agent comprising at least two functional groups selected from azide and/or acetylenic group,
   b) optionally at least one electrical dopant,
   c) at least one solvent,
ii) depositing the solution on a substrate,
iii) removing the solvent, and
iv) reacting the azide and acetylenic groups to effect crosslinking, preferably by heating.

Preferably, the material in step iii) before reaching the gelation point will be present in form of a solid or viscoelastic material before crosslinking in step iv). Also preferably, the material forms a homogeneous thin layer. Most preferably, the layer of non-crosslinked as well as of the crosslinked polymer is amorphous.

The term "viscous material" is related to a liquid having viscosity at 25° C. higher than 1 Pa·s. Viscoelastic materials are viscous liquids which in a sufficiently short timescale show along with plasticity also elastic deformation behaviour.

There can be one starting polymer comprising both complementary crosslinkable moieties A and B, but preferably, the complementary moieties A and B are comprised in two distinct components which are mixed together during the step i). In one embodiment, one of these separated components is a polymer precursor representing crosslinkable moieties A and another one represents crosslinkable moieties B. In another embodiment, crosslinkable moieties B are a polymeric precursor and crosslinkable moieties A represent the second component. Preferably, both crosslinkable moieties A and B are the charge transporting precursor polymers.

In another preferred embodiment, a charge transporting polymer precursor represents one kind of crosslinking moieties (either A or B), and the complementary moieties are used in the form of a low-molecular crosslinker, preferably one of compounds of formula V described above, or in the form of a mixture of more compounds of formula V.

The cycloaddition in step iv) of the inventive method is a [2+3] cycloaddition, also known as Huisgen-reaction, in which an azide group of the crosslinkable moiety A reacts with an acetylenic group of the crosslinkable moiety B under formation of a 1,2,3-triazole ring.

Preferably, the substrate in step ii) is a layer for use in an organic electronic device, more preferably a base electrode, a hole-injecting layer, a hole-transporting layer.

Basically any suitable solvent able to dissolve at least partly the first precursor charge transporting polymer, the second precursor charge transporting polymer, the crosslinking agent as well as the electrical dopant can be chosen. The solubility of the least soluble component should be at least 0.5 mg/ml. For preferred precursor charge transporting polymers containing structural units IIa, IIa', IIb, IIb', IIc, IIc', IId, IId', III and/or IV, as defined above, halogenated and/or aromatic hydrocarbon solvents like dichloromethane, dichloroethane, tetrachloroethane, chlorobenzene, toluene, xylene or anisol are suitable.

In a preferred embodiment, heating in step iv) is heating to a temperature in a range from 60-160° C., preferably 80-140° C., most preferably 100-120° C.

The object is further achieved by a semiconducting device comprising a semi-conducting layer comprising the inventive charge transporting semi-conducting material. The layer comprising the inventive charge transporting semi-conducting material can be made by any conventional technique like spin coating or by a proper printing technique like jet printing, screen printing or offset printing.

Finally, the object is achieved by an ink for jet-printing represented by solution of the step i) of the inventive process.

Surprisingly, it was found that the inventive charge transporting semi-conducting material solves the problem of the present invention due to be obtainable by crosslinking under mild conditions without irradiation, additional initiators or catalyst while retaining its high conductivity, in particular at low cross-linking temperatures.

In the following, the invention will be described in further detail, by the way of examples.

Figure 2A:
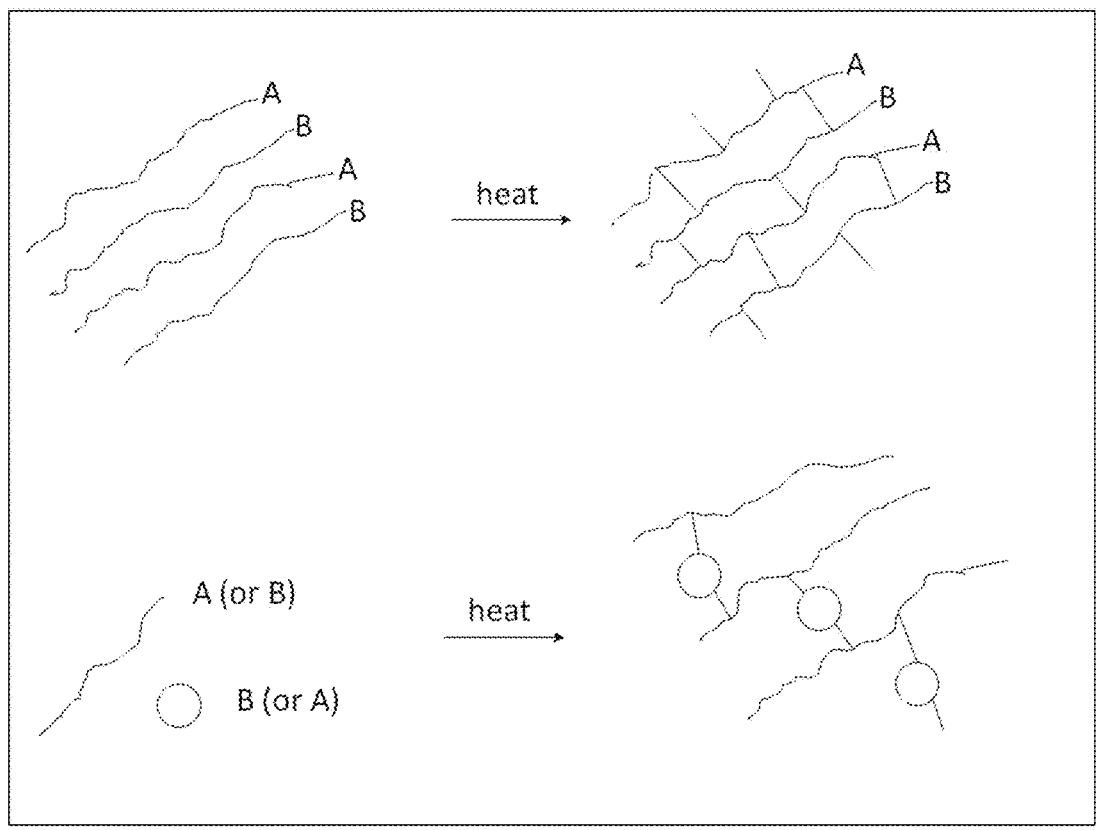
Figure 2B:
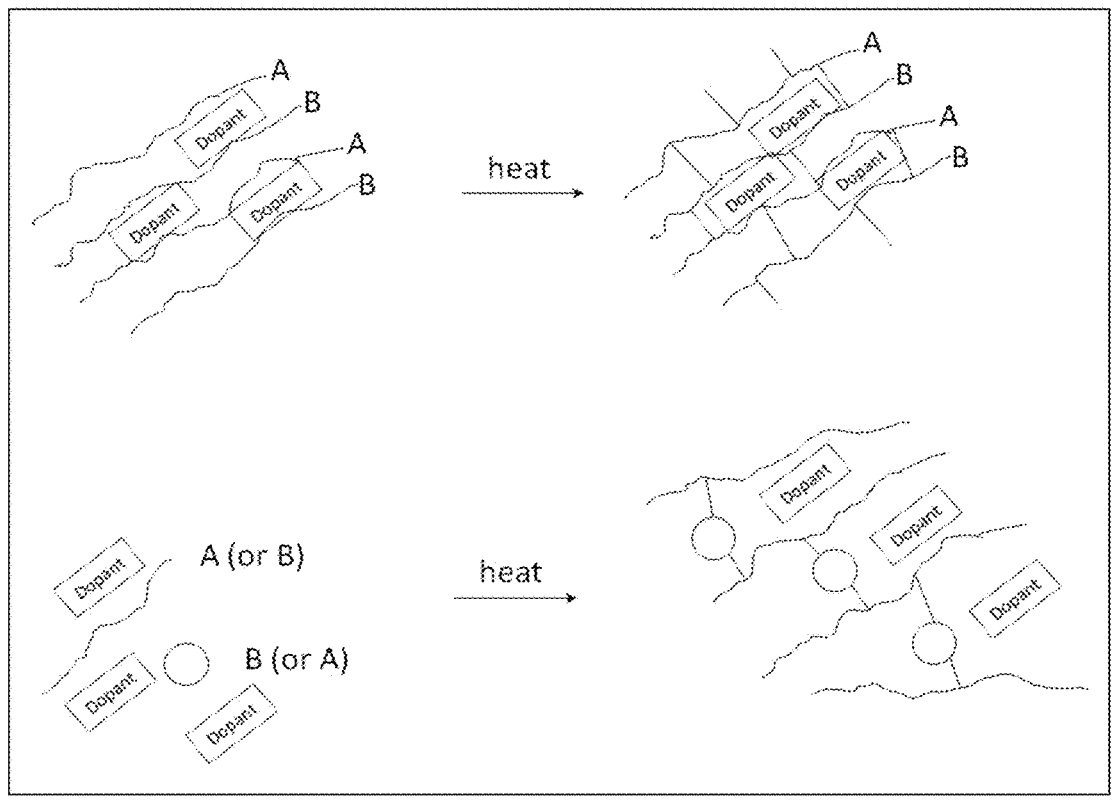
Figure 3:
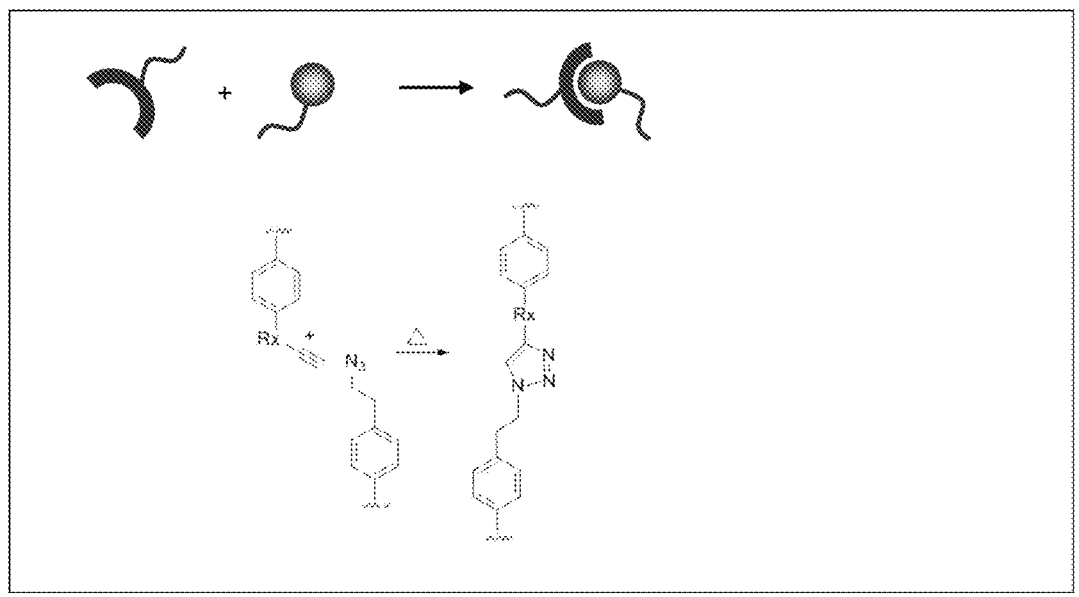
Figure 4:
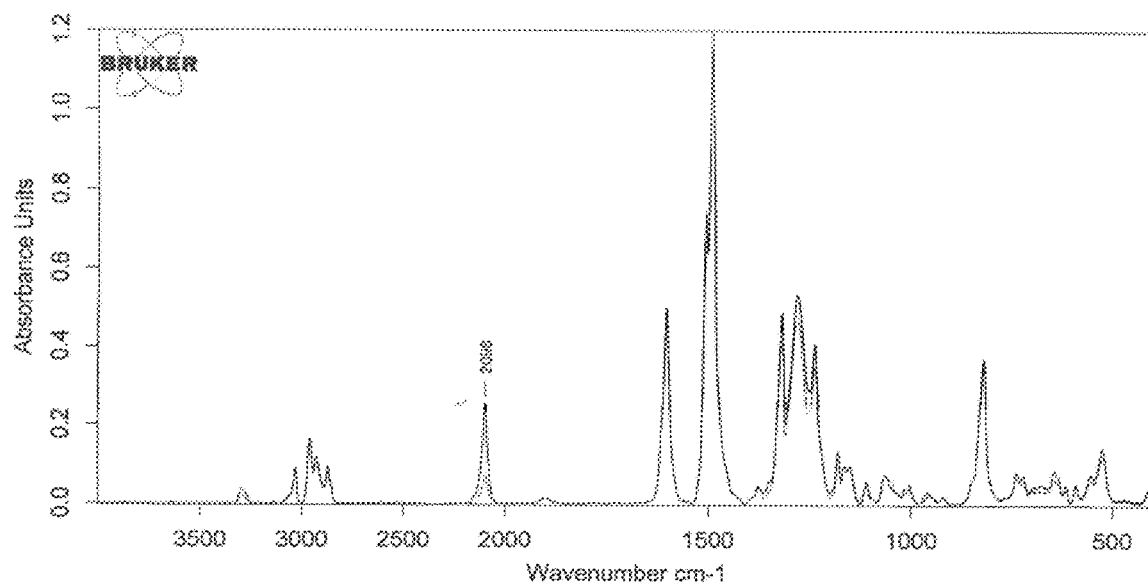
Figure 5A:
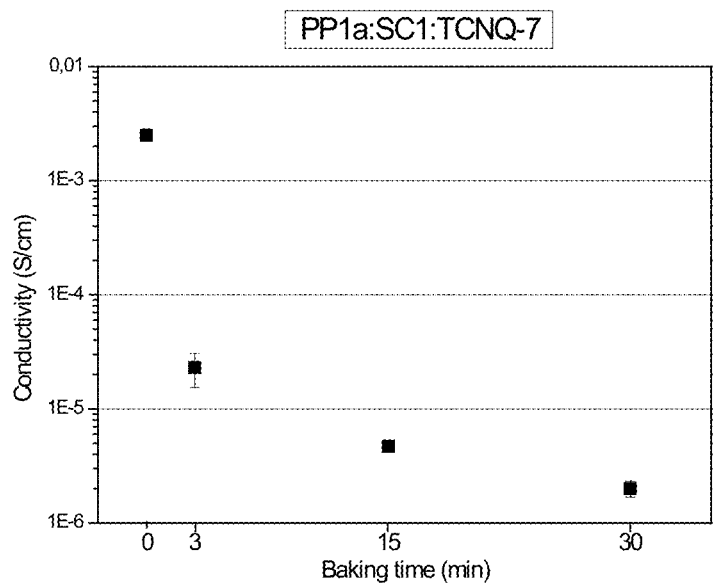
Figure 5B:
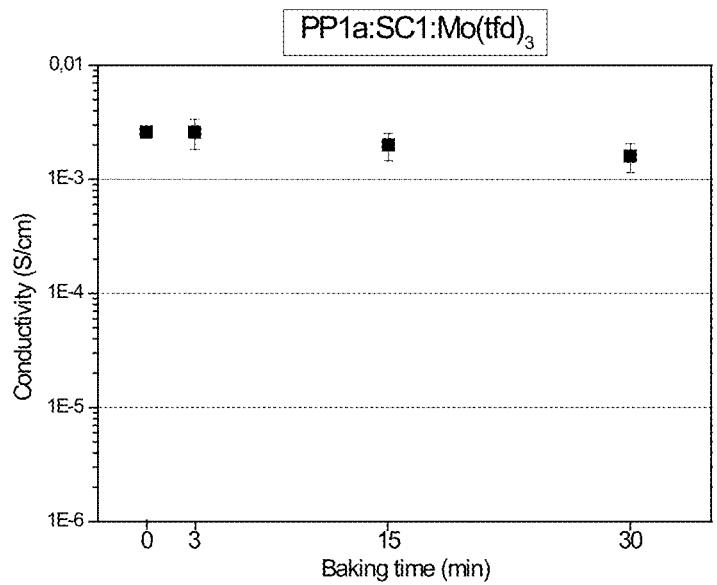
Figure 5C:
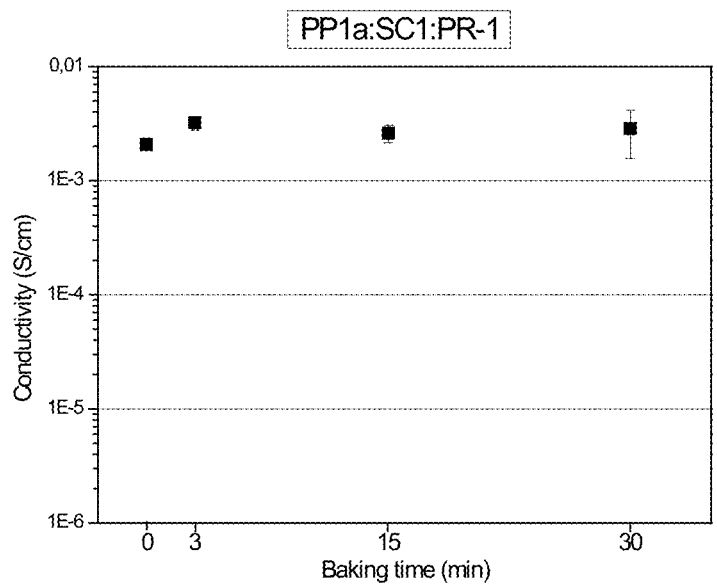
Figure 5D:
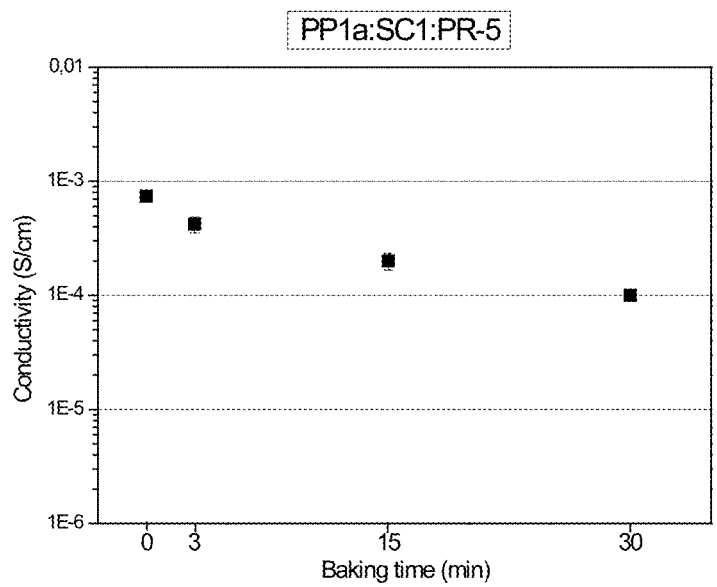
Figure 5E:
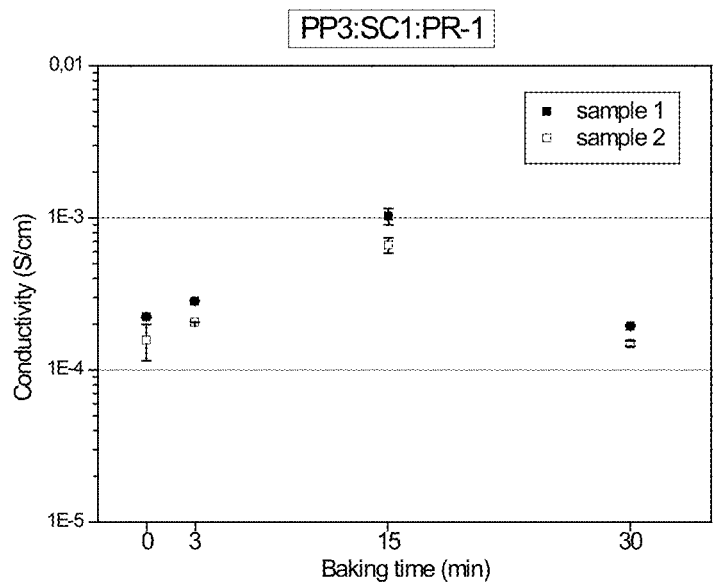
Figure 6A:
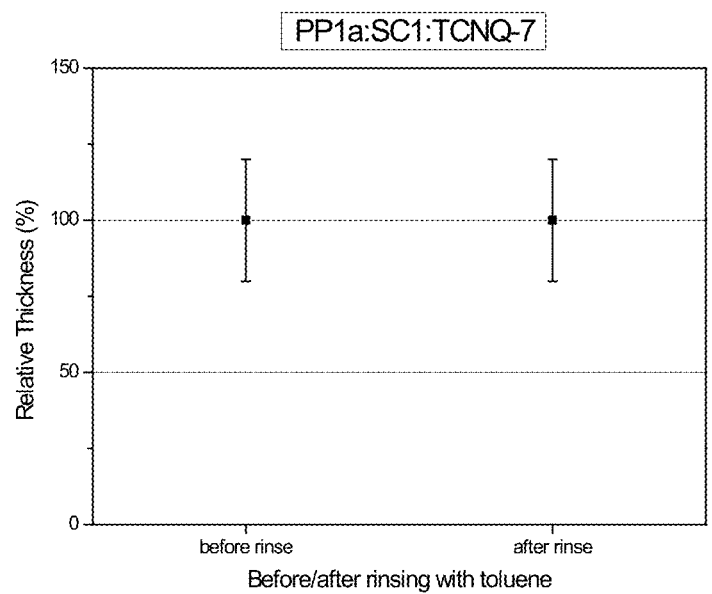
Figure 6B:
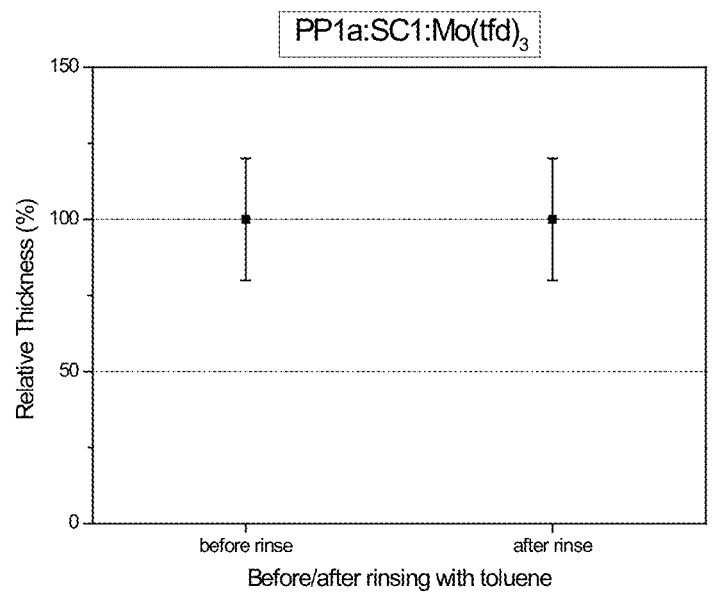
Figure 6C:
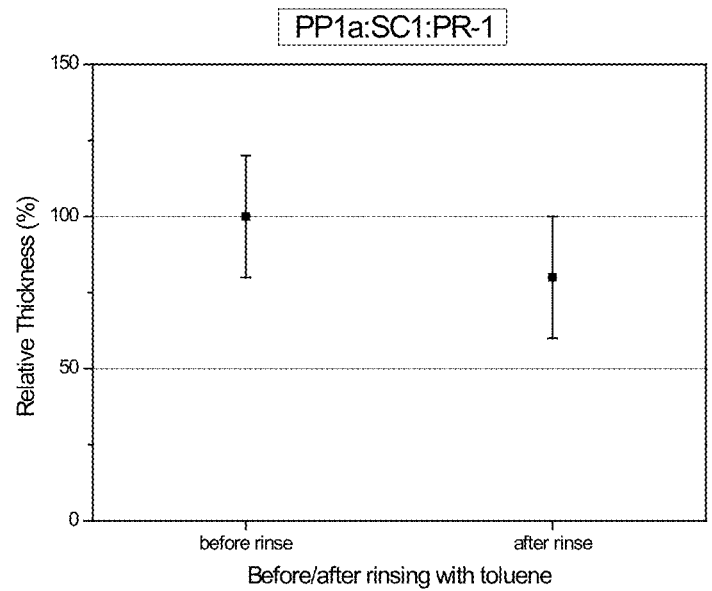
Figure 6D:
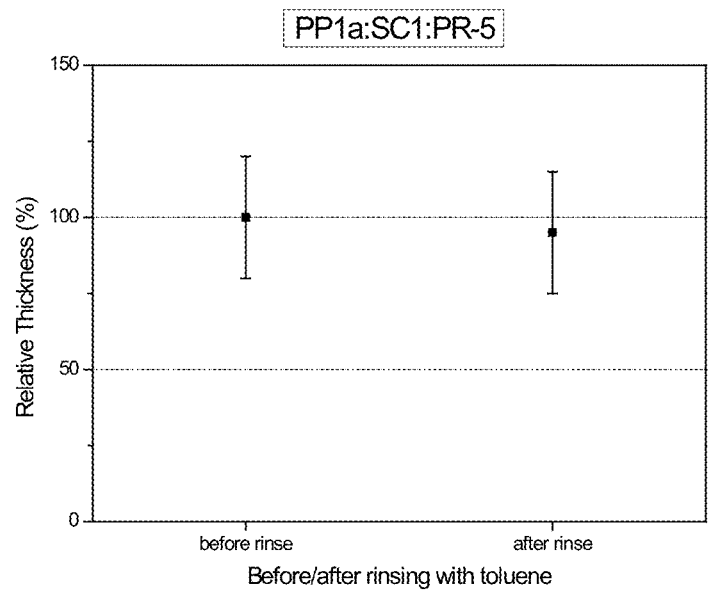
Figure 6E:
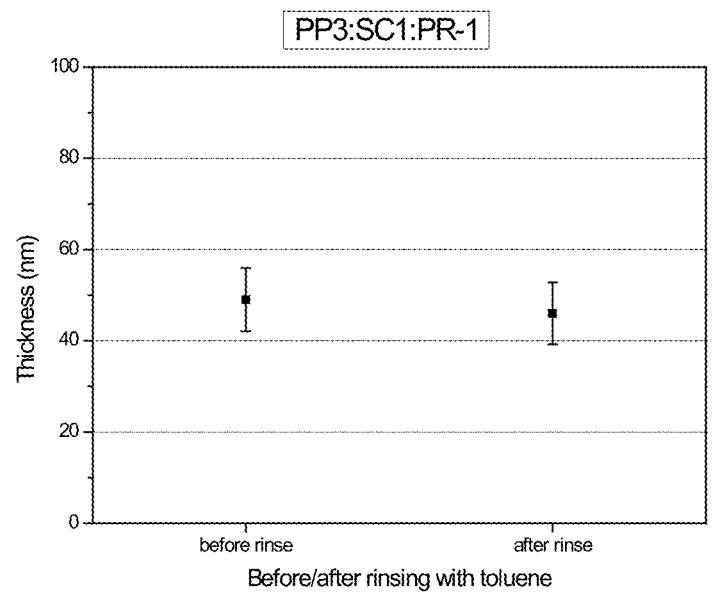
Figure 7:
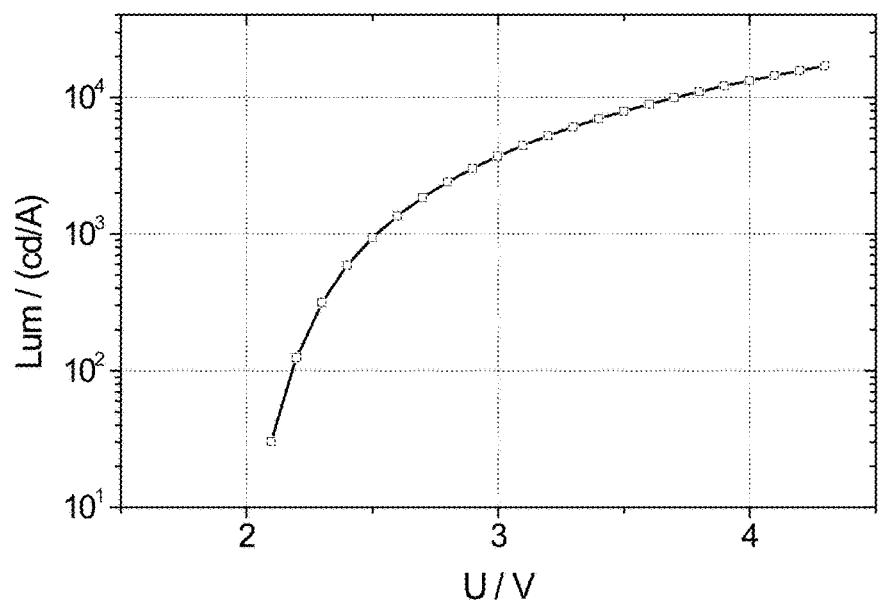
Figure 8:
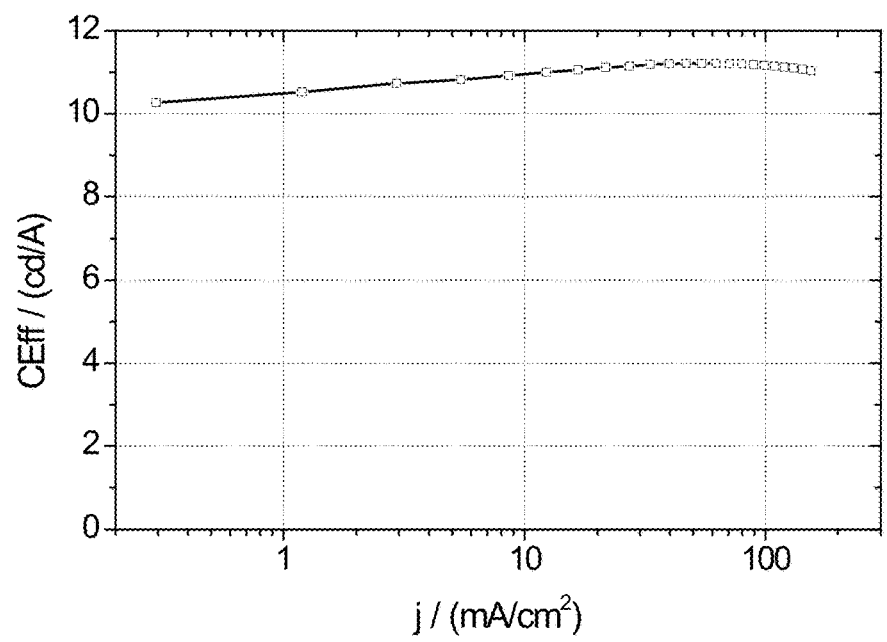

The figures show:

FIG. 1: Scheme of network formation from azide group comprising crosslinkable moieties (A) and acetylenic groups comprising crosslinkable moieties (B);

FIG. 2a: Scheme of the formation of a cross-linked charge transporting polymer without incorporating a dopant; lines mean charge-transporting precursor polymer, circles stand for small-molecule crosslinker, letters show the type of reactive groups in a crosslinkable moiety FIG. 2b: Scheme of the formation of a charge transporting semi-conducting material by incorporating a dopant into the crosslinked charge transporting polymer; lines mean charge-transporting precursor polymer, circles stand for small-molecule crosslinker, letters show the type of reactive groups in a crosslinkable moiety FIG. 3: Scheme of the crosslinking [2+3] cycloaddition;

FIG. 4: Cut of ATR-IR spectra of a non-crosslinked layer according to step iv) of the inventive process before (full line) and after heating of a layer formed from PP1a and SC1 to 120° C. for 1 hour (dashed line). The decrease of the peak at 2.096 $cm^{-1}$ shows high conversion of azide groups;

FIG. 5a: Diagram illustrating the conductivity of the semiconducting material comprising crosslinked polymer PP1-SC1 doped with TCNQ-7 in dependence on heating duration at 120° C.;

FIG. 5b: Diagram illustrating the conductivity of the semiconducting material comprising crosslinked polymer PP1-SC1 doped with Mo(tfd)$_3$ in dependence on heating duration at 120° C.;

FIG. 5c: Diagram illustrating the conductivity of the semiconducting material comprising crosslinked polymer PP1-SC1 doped with PR-1 in dependence on heating duration at 120° C.;

FIG. 5d: Diagram illustrating the conductivity of the semiconducting material comprising crosslinked polymer PP1-SC1 doped with PR-5 in dependence on heating duration at 120° C.;

FIG. 5*e*: Diagram illustrating the conductivity of the semiconducting material comprising crosslinked polymer PP3-SC1 doped with PR-1 in dependence on heating duration at 120° C.;

FIG. 6*a*: Diagram illustrating relative thickness of the semiconducting crosslinked layer made from PP1-SC1 doped with TCNQ-7 before and after rinsing with toluene. The bars show the experimental uncertainty of the values shown;

FIG. 6*b*: Diagram illustrating relative thickness of the semiconducting crosslinked layer made from PP1-SC1 doped with Mo(tfd)$_3$ before and after rinsing with toluene;

FIG. 6*c*: Diagram illustrating relative thickness of the semiconducting crosslinked layer made from PP1-SC1 doped with PR-1 before and after rinsing with toluene;

FIG. 6*d*: Diagram illustrating relative thickness of the semiconducting crosslinked layer made from PP1-SC1 doped with PR-5 before and after rinsing with toluene;

FIG. 6*e* Diagram illustrating relative thickness of the semiconducting crosslinked layer made from PP3-SC1 doped with PR-1 before and after rinsing with toluene;

FIG. 7: Graph of luminance of the red OLED in dependence on the voltage;

FIG. 8: Graph of efficiency of the red OLED in dependence on the current density.

Figure 9:
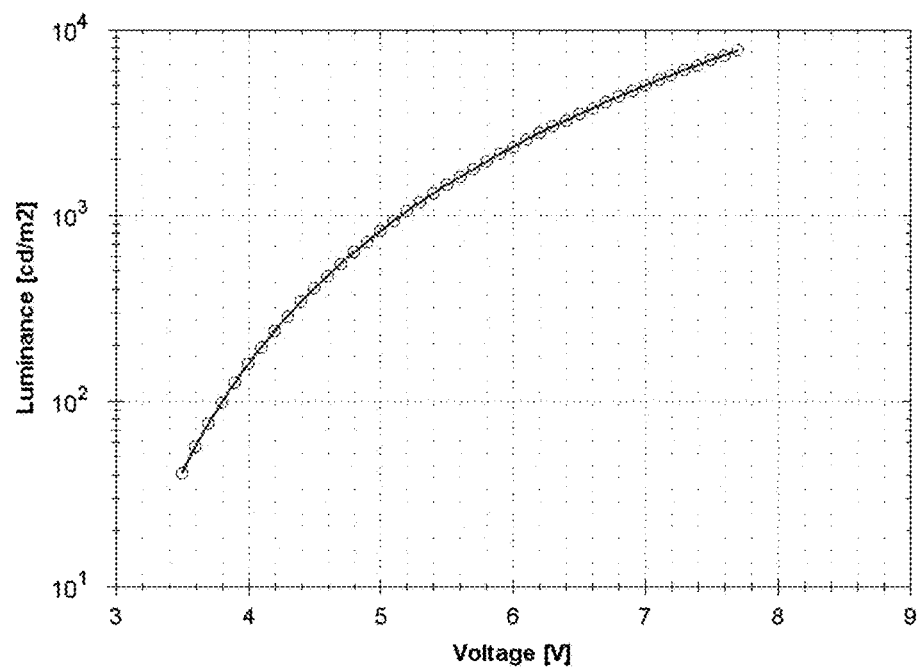
Figure 10:
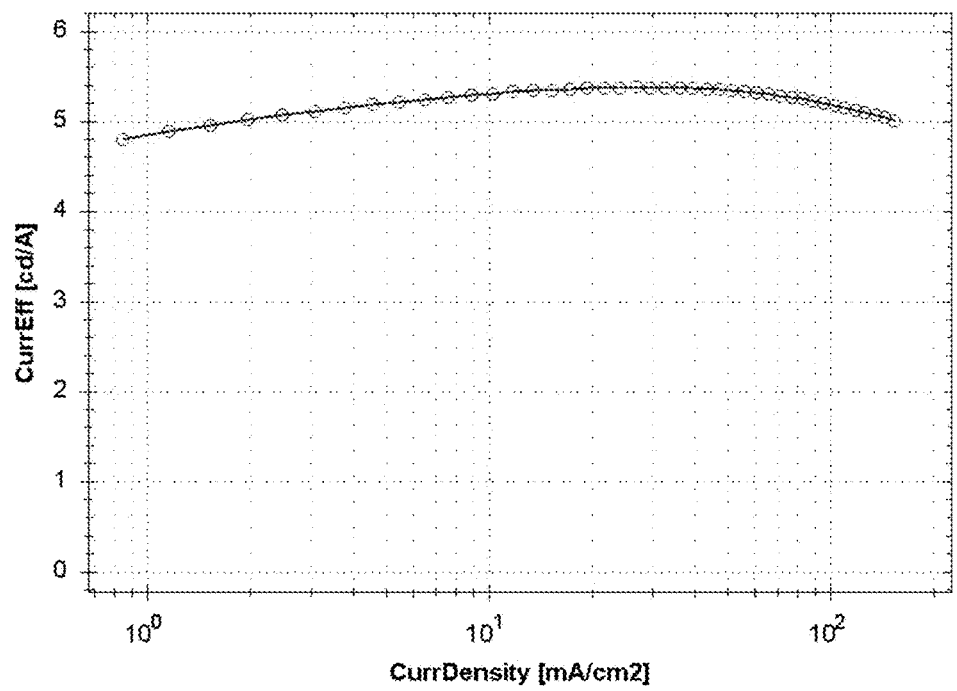

FIG. 9: Graph of luminance of the blue OLED in dependence on the voltage;

FIG. 10: Graph of efficiency of the red OLED in dependence on the current density.

FIG. 11: A photograph of a jet-printed pattern of Example J

EXAMPLES

Several precursor charge transporting polymers and small molecule crosslinkers, listed in Tab. 1, were prepared and used for preparing the inventive charge transporting semiconducting material.

TABLE 1

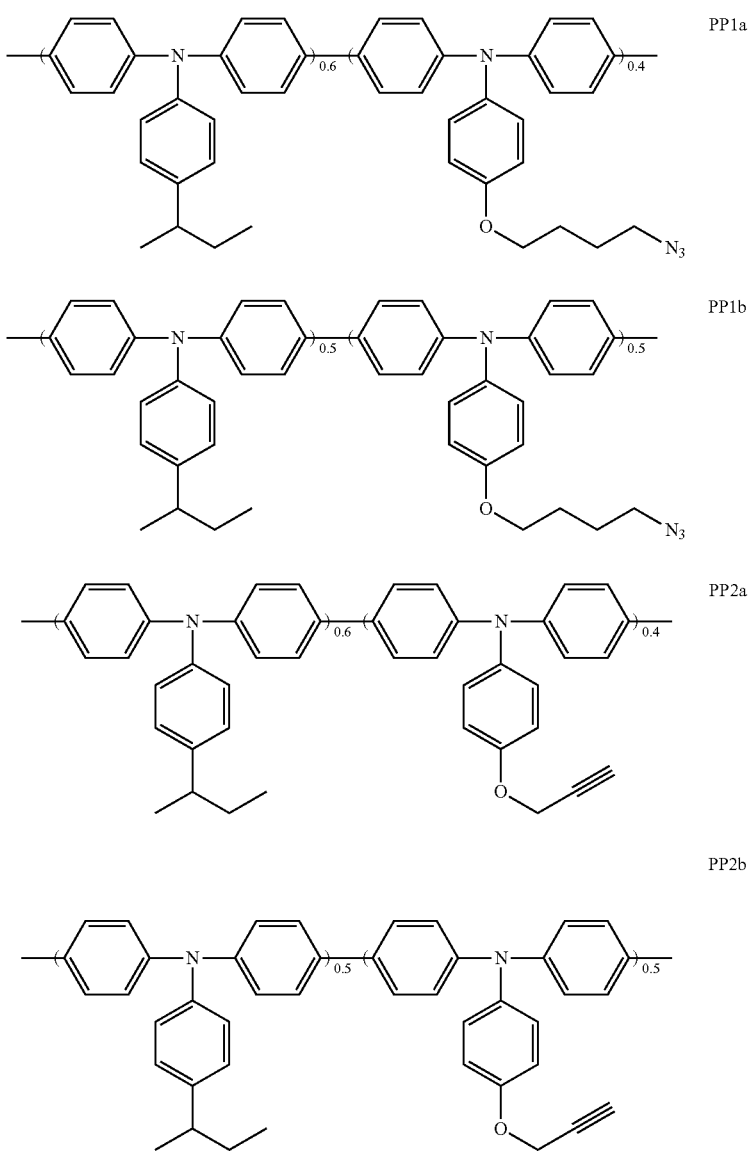

TABLE 1-continued
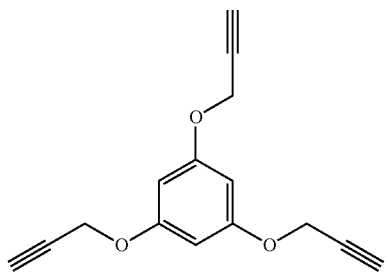 [SMILES: C#CCOc1cc(OCC#C)cc(OCC#C)c1]
SC1
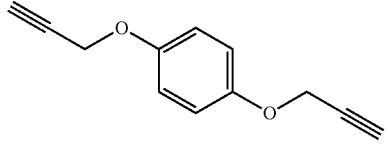
SC2
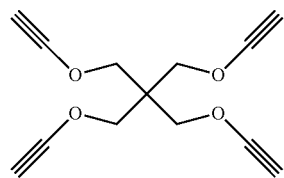 [SMILES: C#COCC(COC#C)(COC#C)COC#C]
SC3
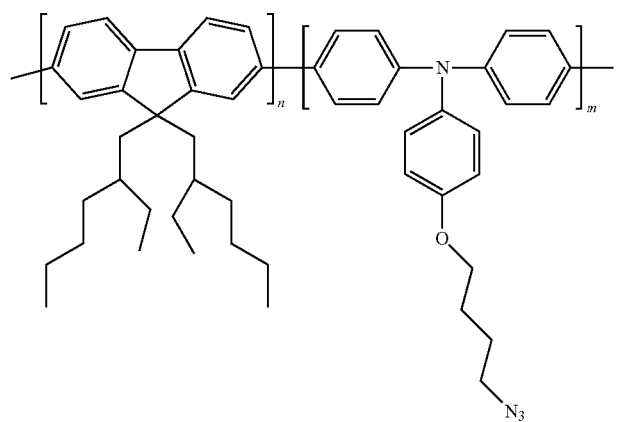
PP3
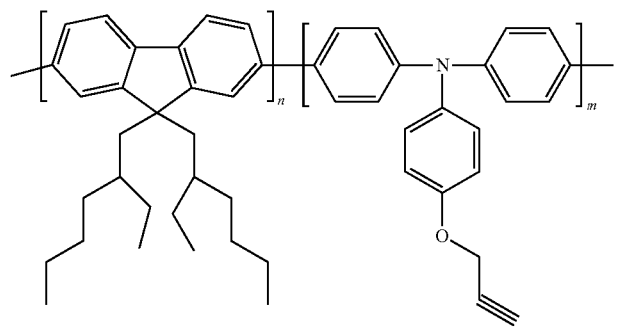
PP4

TABLE 1-continued
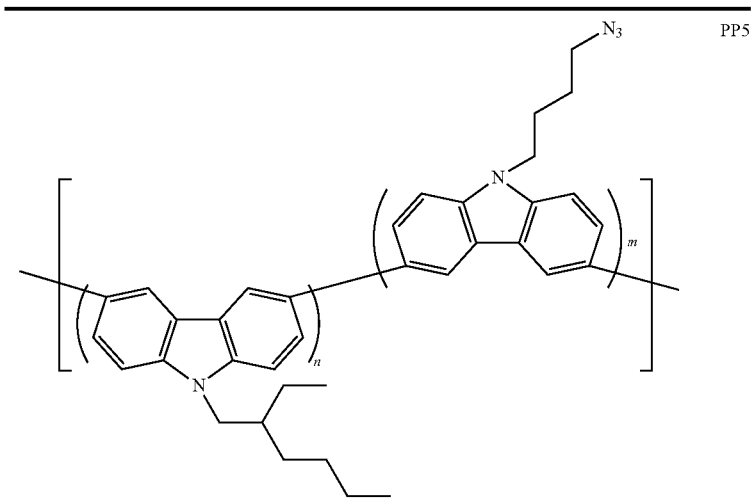
PP5
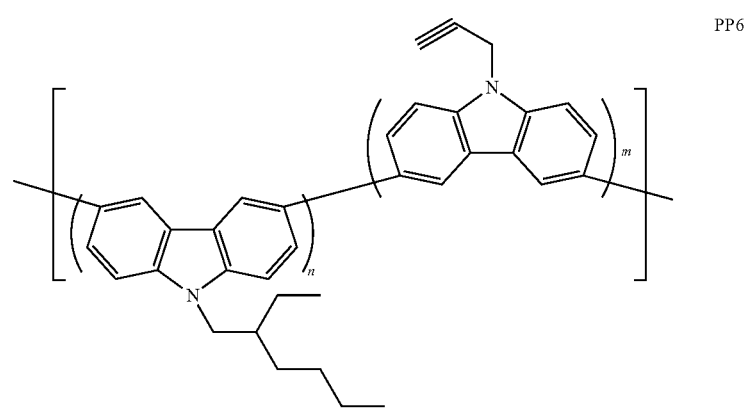
PP6
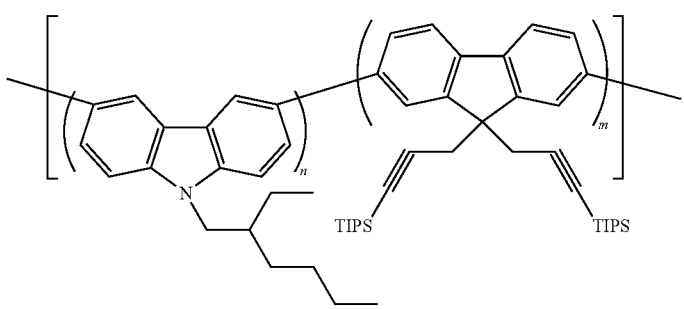
PP7
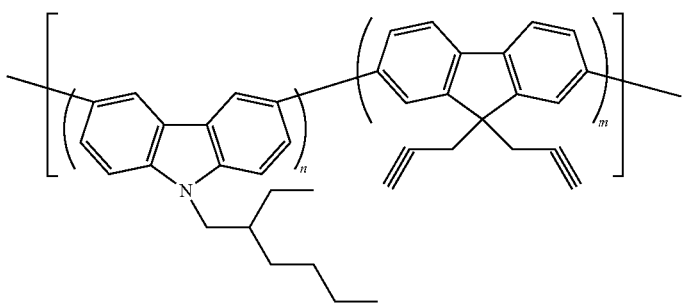
PP8

TABLE 1-continued
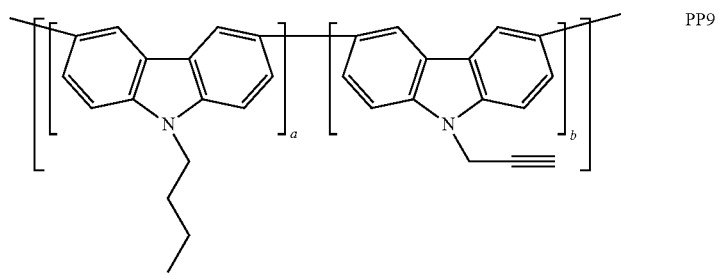
PP9
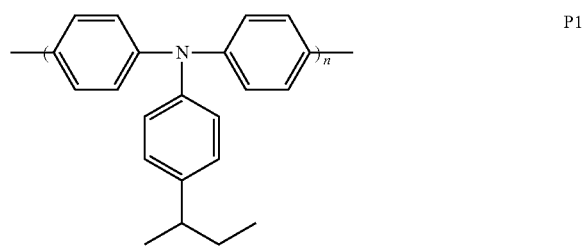
P1
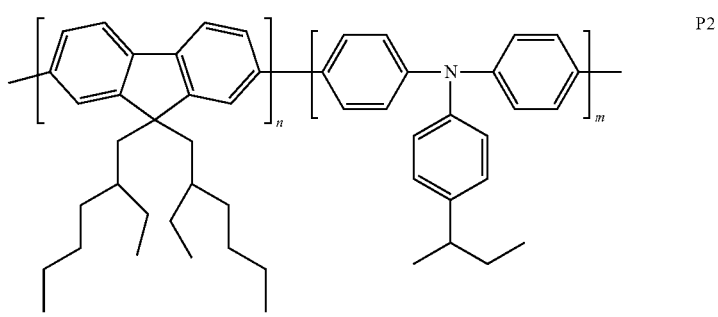
P2
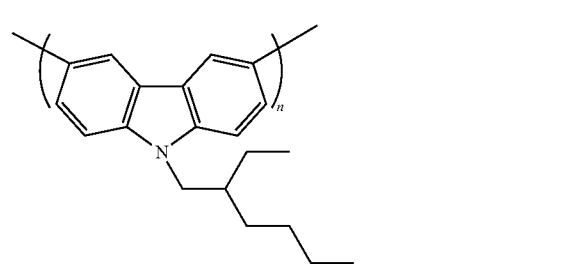
P3
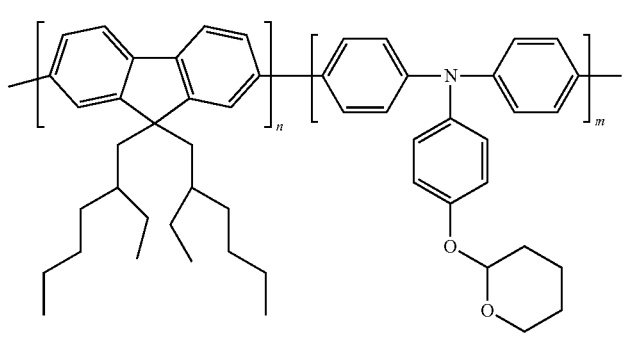
PI2

TABLE 1-continued

PI3

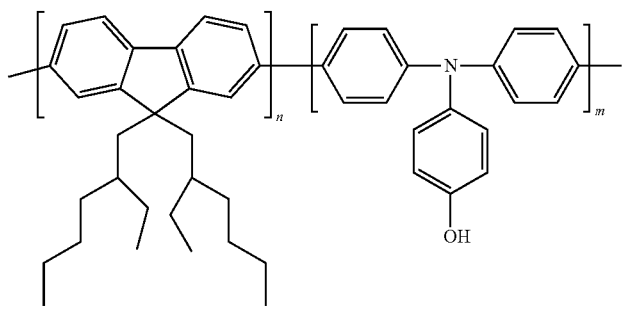

PI4

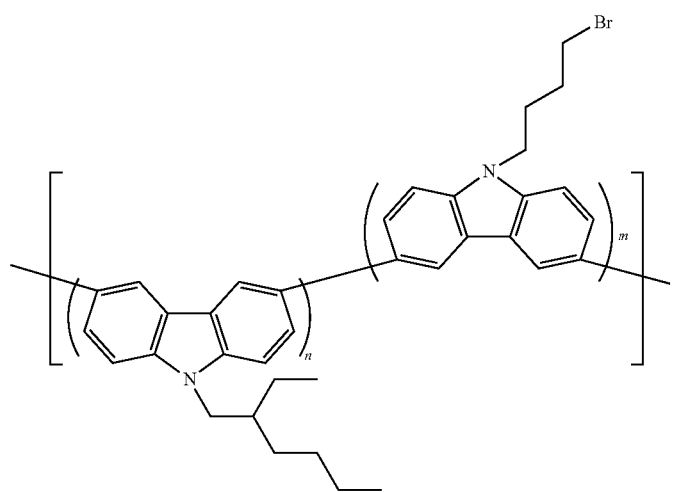

PI5

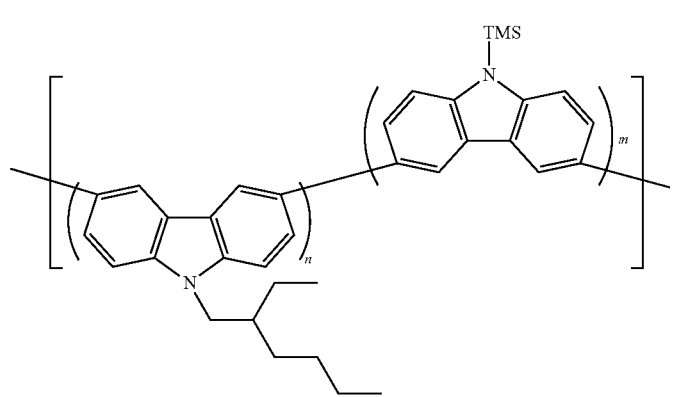

General Methods.

Gel permeation chromatography (GPC) measurements of polymer molecular weights were carried out on Agilent 1100 Series (Agilent, USA) normal-temperature size exclusion chromatograph, equipped with a refractive index detector and one column PL Gel MIXED-B (Polymer Laboratories, U.K.); the eluent was tetrahydrofuran (THF), and the flow rate was 1 mL/min. Number-average molecular weights ($M_n$) and polydispersity indexes (PDI) of the obtained polymers were determined based on calibration with polystyrene standards obtained from Polymer Standards Service (PSS, Germany).

Starting Materials for Polymer Preparation

2-{4-[bis(4-bromophenyl)amino]phenyl}butan-2-ol (1)

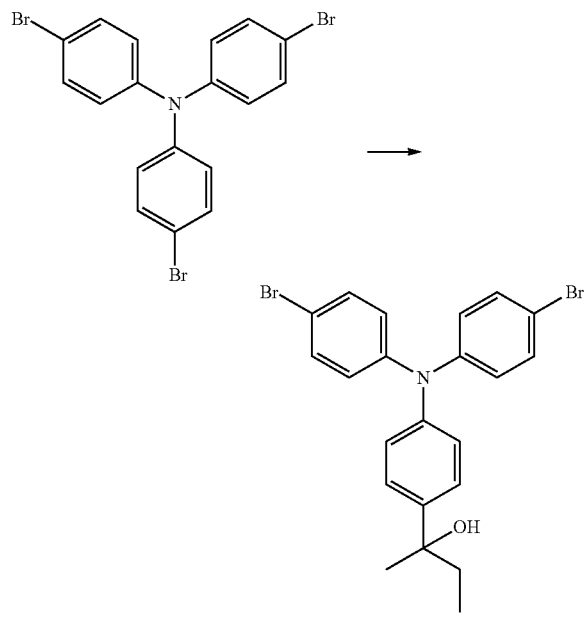

Tris(4-bromophenyl)amine (12.05 g, 25 mmol) was dissolved in 250 ml dry THF under argon and cooled down to −78° C. on acetone-dry ice bath. n-BuLi (2.5 M solution in hexane, 10 ml, 1 eq.) was added dropwise during 15 min. The mixture was stirred for next 15 min at −78° C. and quenched with excess of methylethylketone (5 ml).

The solvent was evaporated at reduced pressure, a residue dissolved in ethyl acetate (100 ml), washed subsequently with 1% hydrochloric acid, saturated aqueous sodium bicarbonate and brine and dried over $MgSO_4$. After evaporation of the solvent, crude product was obtained as viscous colorless liquid. Purification by column chromatography ($SiO_2$, diethyl ether) afforded 9.2 g (1) as a white solid. (Yield ~79% of theory, based on tris(4-bromo-phenyl)amine).

4-bromo-N-(4-bromophenyl)-N-[4-(butan-2-yl)phenyl]aniline (2)

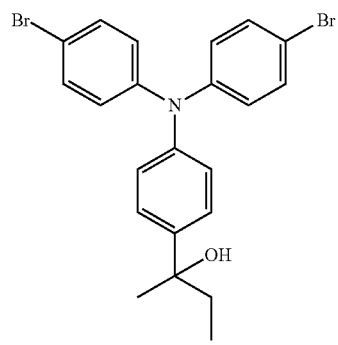

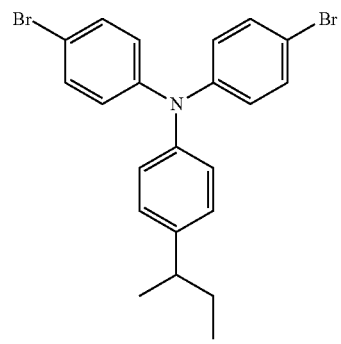

(1) (8.77 g, 18.5 mmol) and $NaBH_4$ (1.406 g, 37 mmol) were placed into a round-bottom flask, equipped with magnetic stirring bar, the flask was sealed by rubber septum and the atmosphere was replaced by argon. Dry diethyl ether (100 ml) was added by syringe, and the mixture was cooled to −78° C. on acetone-dry ice bath. Trifluoromethansulfonic acid (6 g, 40 mmol) was added at this temperature dropwise during 1 h. The mixture was allowed to warm up to the room temperature overnight. The solution was cooled on ice-bath and water (10 ml) was added in small portions. The acid was neutralized with 10% aqueous NaOH solution, and product extracted three times with diethyl ether. Combined ether fraction was washed with brine and dried over $MgSO_4$. After the solvent removal at reduced pressure, crude product was obtained as very viscous liquid. Purification was done by column chromatography ($SiO_2$, hexane-$CH_2Cl_2$ 2:1). Yield 6.9 g (81%)

4-[bis(4-bromophenyl)amino]phenol (3)

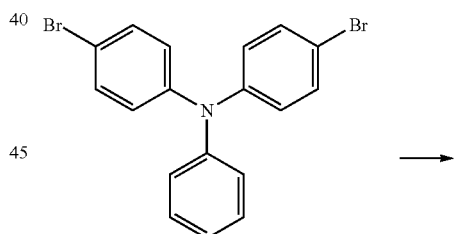

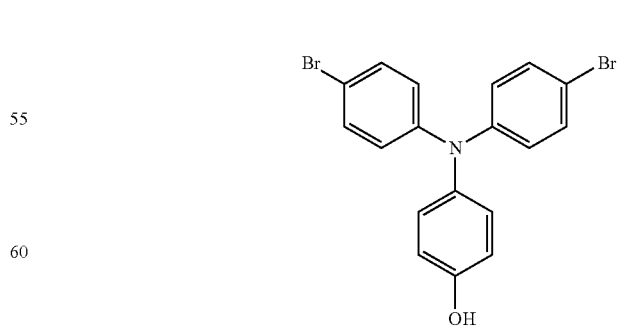

Tris(4-bromophenyl)amine (12.05 g, 25 mmol) was dissolved in 250 ml dry THF under argon and cooled down to −78° C. on acetone-dry ice bath. n-BuLi (2.5 M solution in hexane, 10 ml, 1 eq.) was added dropwise at this temperature during 30 min. The mixture was stirred for next 15 min at −78° C. and triisopropylborate (8.6 ml, 1.5 eq.) was added at this temperature in one portion. The cooling bath was removed and the mixture was allowed to reach room temperature during ~1 h. Solution was re-cooled to −10° C., acetic acid (1.9 ml, 1.3 eq.) was added and the mixture was stirred at room temperature for 30 minutes. Then, aqueous hydrogen peroxide (2.83 g of 30% solution diluted with 20 ml water) was added to the mixture, maintaining the temperature below 0° C. (salt-ice bath). After the peroxide addition was complete, the mixture was stirred overnight, quenched with an aqueous $Na_2S_2O_3$ solution and extracted with diethyl ether. Organic layer was separated, washed with brine and dried over magnesium sulfate. Crude product, obtained after solvent evaporation, was purified by column chromatography ($SiO_2$, eluent $CH_2Cl_2$). Yield 7.7 g (73%).

4-bromo-N-(4-(4-bromobutoxy)phenyl)-N-(4-bromophenyl)aniline (4)

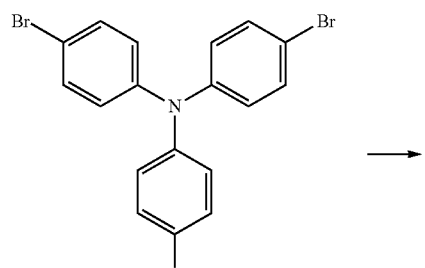

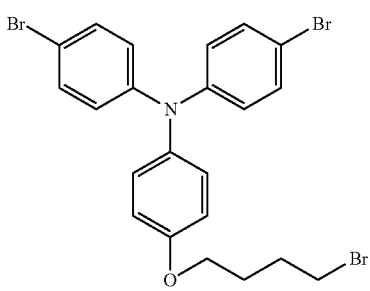

Anhydrous THF (10 ml) was added to the mixture of (3) (0.418 g, 1 mmol), anhydrous potassium carbonate (1.5 eq., 0.207 g, 1.5 mmol) and catalytic amount (5 mol %) 18-crown-6. The mixture was heated to reflux for 1 h before 1,4-dibromobutane (5 eq, 5 mmol, 1.080 g) was added in one portion. Reaction mixture was heated at reflux overnight, poured into water and extracted with ether. The organic phase was washed with brine, dried over magnesium sulfate and filtered. Crude product, obtained after solvent evaporation, was purified by column chromatography (hexane:ethyl acetate 1:1) affording 0.51 g (95%) title compound as very viscous clear oil.

2-(4-(bis(4-bromophenyl)methyl)phenoxy)tetrahydro-2H-pyran (5)

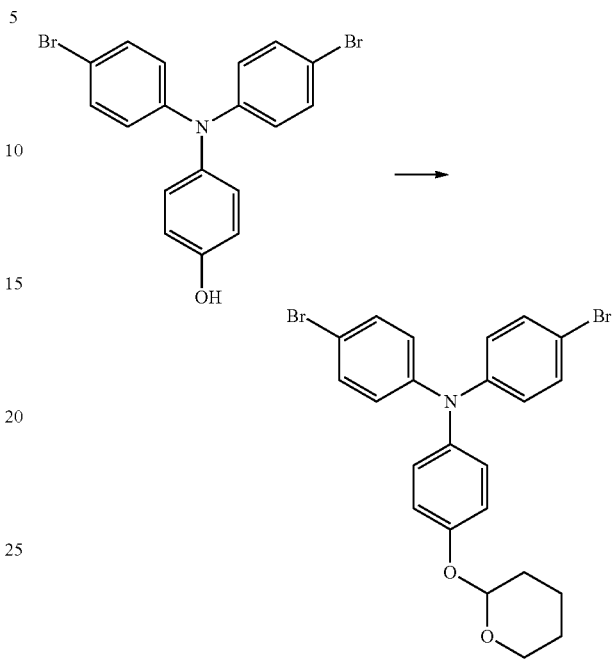

To a (3) solution (2.1 g, 5 mmol) in dry dichloromethane, dihydropyran (1 mL, 11 mmol) and a catalytic amount of camphorsulfonic acid (14 mg, 0.06 mmol) were added at 0° C. The solution was stirred overnight at room temperature, poured into a saturated sodium hydrocarbonate solution, extracted with diethyl ether, washed with brine, dried over magnesium sulfate. The solvent was removed under reduced pressure and the residue purified by column chromatography ($SiO_2$, hexane:diethylether 1:1). Yield 2.4 g (96% of theoretical).

3,6-dibromo-9-(2-ethylhexyl)-9H-carbazole (6)

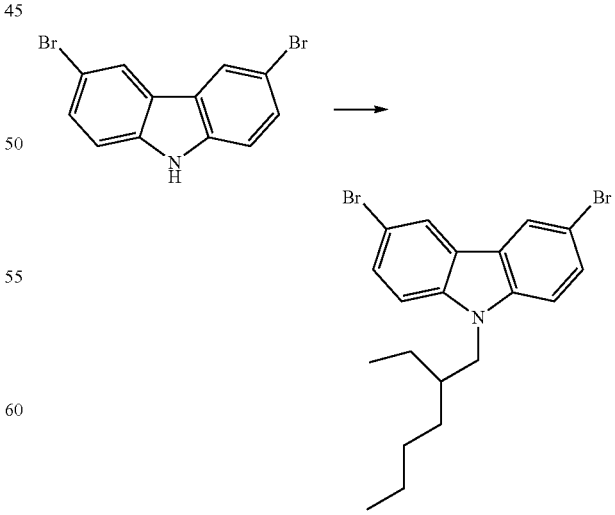

A double-necked, flame-dried, 500 mL round-bottomed flask equipped with a magnetic stir bar and an argon inlet, was charged with potassium hydroxide (5.61 g, 100 mmol) and 3,6-dibromo-9H-carbazole (6.5 g 20 mmol), flushed with argon and sealed with a rubber septum. 100 mL anhydrous DMF were added under argon via cannula and the mixture was stirred for 30 minutes at room temperature. 1-bromo-2-ethylhexane (5.79 g, 30 mmol) was added dropwise by a syringe and the resulting mixture was stirred overnight at room temperature before it was poured into 300 mL of water, acidified to pH<7 by addition of concentrated HCl (35 wt. % aqueous solution) and extracted four times with CHCl₃ (each portion 50 mL). The combined organic phase was washed with saturated aqueous NaHCO₃ solution (1x), brine (5x), dried over MgSO₄ and evaporated to dryness. The crude product was purified by column chromatography (SiO₂, hexane-ethyl acetate 3:1 v/v).

Yield: 8.3 g (95%)

3,6-dibromo-9-(4-bromobutyl)-9H-carbazole (7)

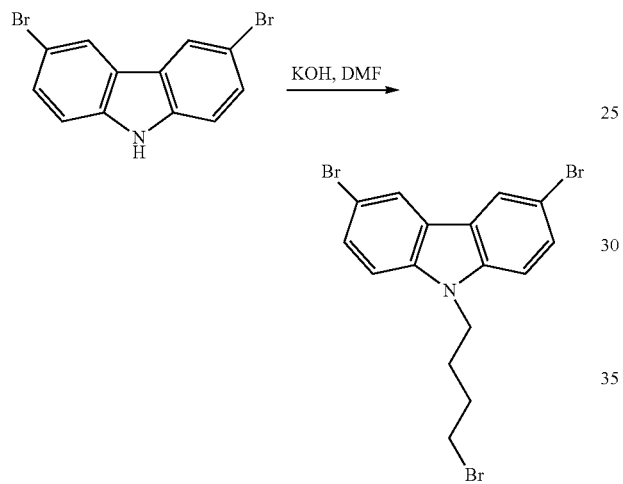

A double-necked, flame-dried, 500-mL round-bottomed flask equipped with a magnetic stir bar and an argon inlet, was charged with carbazole (11.37 g, 35 mmol) and potassium hydroxide (2.36 g, 42 mmol, 1.2 eq), flushed with argon sealed with a rubber septum. 200 mL anhydrous DMF were added under argon via cannula and the mixture was stirred for 30 minutes at room temperature. 16.5 g 1,4-dibromobutane (76.4 mmol-2.2 eq.) were added by a syringe in one portion, the resulting mixture was stirred at room temperature overnight, poured into ~500 mL water and extracted with chloroform (4×150 mL). Combined organic layers were washed with water (2×), brine (2×), dried over magnesium sulfate and filtered. The solvent and other volatile residues were removed by vacuum distillation and the residue was purified by column chromatography on SiO₂ with hexane:ethyl acetate (3:1 v/v) as an eluent.

Yield: ~8.8 g (54.4%)

2,7-dibromo-9,9-di(prop-2-yn-1-yl)-9H-fluorene (8)

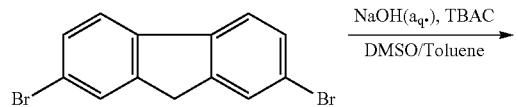

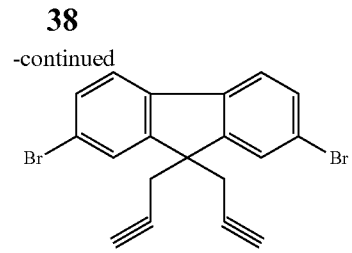

A 100-mL, three-necked, round-bottomed flask was fitted with a stirring bar, dropping funnel, thermometer, and an argon inlet. The flask was charged with 2,7-dibromo-9H-fluorene (3.24 g, 10 mmol), 6 mL toluene, 50 mL DMSO, 5 mL 50 wt. % aqueous NaOH solution and 50 mg tetrabutyl ammonium chloride (TBAC), flushed with an inert gas and sealed. 6 g 3-bromoprop-1-yne (5 eq., 50 mmol) were added dropwise to the solution at the temperature below 20° C. (under cooling with a water-ice bath). The mixture was stirred under inert gas overnight at RT. The volatiles (toluene, propargyl bromide excess) were removed at a reduced pressure. The residue was diluted with water, the product was separated by filtration and washed with water (5×10 mL) and methanol (3×5 mL). The crude product was purified by crystallization from EtOH.

Yield 2.7 g (63%)

((2,7-dibromo-9H-fluorene-9,9-diyl)bis(prop-1-yne-3,1-diyl))bis(triisopropylsilane) (9)

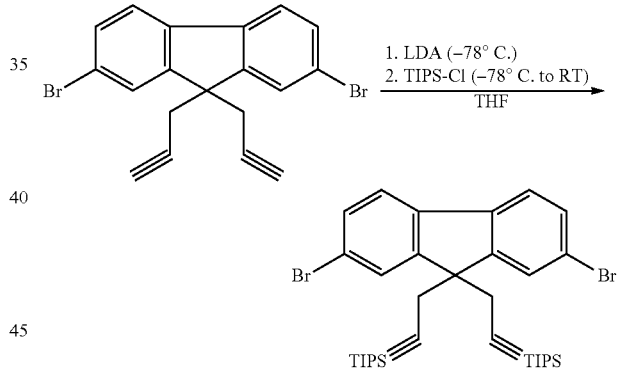

2,7-dibromo-9,9-di(prop-2-yn-1-yl)-9H-fluorene (1.69 g, 4 mmol) was dissolved in 40 mL dry THF under argon and cooled down to −78° C. 6.4 mL lithium diisopropyl amide (LDA) 1.5 M solution in cyclohexane (9.6 mmol, 2.4 eq.) were added dropwise at this temperature during 15 min. The mixture was stirred for the 1 hour at −78° C. before chlorotriisopropylsilane (9.6 mmol, 1.85 g, 2.4 eq.) was added dropwise. The mixture was allowed to reach room temperature overnight, then re-cooled to 0° C. with ice-bath and quenched by addition of the saturated aqueous NH₄Cl solution (1 mL). The mixture was transferred to a separatory funnel charged with 50 mL diethyl ether and 300 mL water. The organic phase was separated and the water phase was repeatedly extracted with diethyl ether (3×30 mL). The combined organic layers were washed with brine and dried over magnesium sulfate. The crude product, obtained after the solvent evaporation, was purified by column chromatography.

Yield 2.27 g (80%)

Tri-tert-butylphosphinopalladium (II) dichloride (10)

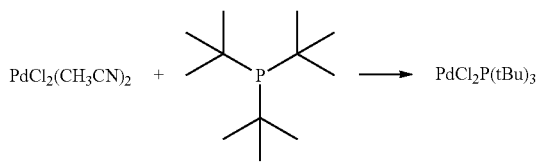

The synthesis was performed in an argon box. A single-necked, flame-dried, 50 mL round-bottomed flask equipped with a magnetic stir-bar was charged with bis(acetonitrile)palladium(II) dichloride complex (0.52 g, 2 mmol), diethyl ether (25 ml) and tri-tert-butylphosphine (0.61 g, 3 mmol, 1.5 eq.). The mixture was stirred under argon at room temperature overnight. 25 ml hexane were added, the precipitated product was separated by filtration, washed with hexane and dried in vacuum at room temperature.

Yield: 1.13 g (74%)

Typical Co-Polymerization Procedures.

1. Kumada Catalyst-Transfer Polycondensation (KCTP)

a) Preparation of Monomer Solution

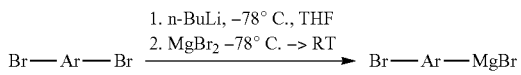

Dibromo-monomer precursor (1 mmol) was placed into round-bottom flask equipped with magnetic stirring-bar, the flask was sealed and the air replaced by argon. 10 mL dry THF were added via syringe and the solution was cooled to −78° C. using a dry ice-acetone bath. n-BuLi solution (1 eq.) was added at this temperature during 15 min and the mixture was stirred for 15 minutes. An addition of MgBr$_2$ (1.1 mmol, 0.202 g) solution in THF followed. The reaction was allowed to reach RT over 30 min.

b) Polymerisation Procedure

Monomer solutions, prepared separately from different dibromo-monomer precursors, were mixed together in the desired proportion under argon and then catalyst suspension (typically 0.01 eq. of [1,3-Bis(diphenylphosphino)propane]dichloronickel(II) in THF) was added via septum by syringe. Polymerisation was allowed to proceed overnight at room temperature and terminated by addition of the methanol. Crude polymer was obtained by precipitation in excess of the methanol. Purification of the polymer was done by triple re-precipitation in methanol from a toluene solution.

2. Negishi Catalyst-Transfer Polycondensation (NCTP)

a) Preparation of Monomer Solution

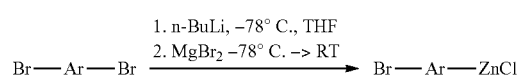

Dibromo-monomer precursor (1 mmol) was placed into round-bottom flask equipped with magnetic stirring-bar, the flask was sealed and the air replaced by argon. Dry THF (10 ml) was added by syringe and the solution was cooled to −78° C. using dry ice-acetone bath. n-BuLi solution (1 eq.) was added at this temperature during 15 min, the mixture was stirred for 15 minute. An addition of ZnCl$_2$ (1.1 mmol, 1.1 eq) solution in THF followed. Reaction was allowed to reach room temperature over 30 min.

b) Polymerization Procedure

Monomer solutions, prepared separately from different dibromo-monomer precursors, were mixed together in the desired proportion under argon and then catalyst suspension (typically 0.01 eq. tri-tert-butylphosphinopalladium(II) dichloride (10) in THF) was added via septum by syringe. Polymerisation was allowed to proceed 15 minutes at room temperature and terminated by addition of the methanol. Crude polymer was obtained by precipitation in excess of the methanol. Purification of the polymer from Pd-residues was done in a followed way. The crude material was dissolved in 40 mL toluene and treated with 5 mL of 1% (wt.) aqueous sodium diethyldithiocarbamate solution overnight. The organic layer was separated, washed with brine, dried over MgSO4 and evaporated to a half of its initial volume. The crude polymer was obtained by precipitation of this solution with tenfold excess methanol as a pale yellow solid.

Example Co-Polymerization Procedure.

a) Preparation of Monomer Solutions

1.

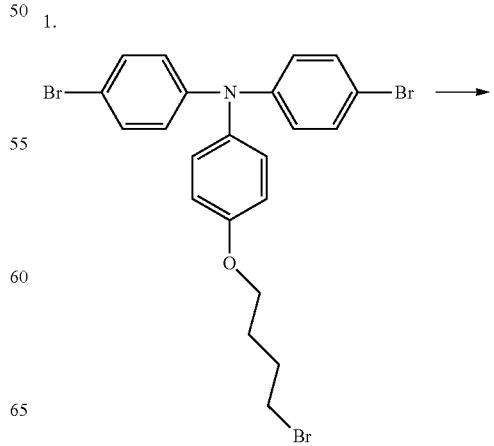

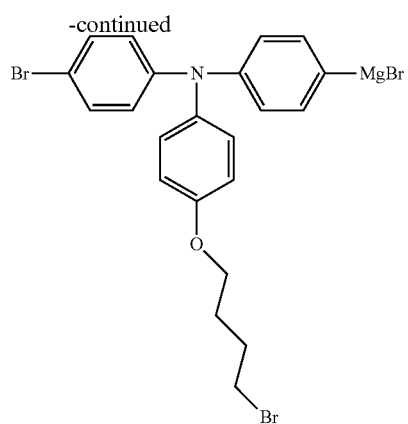

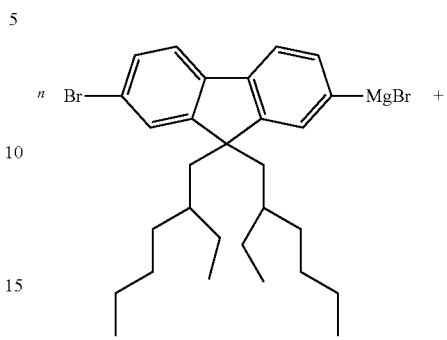

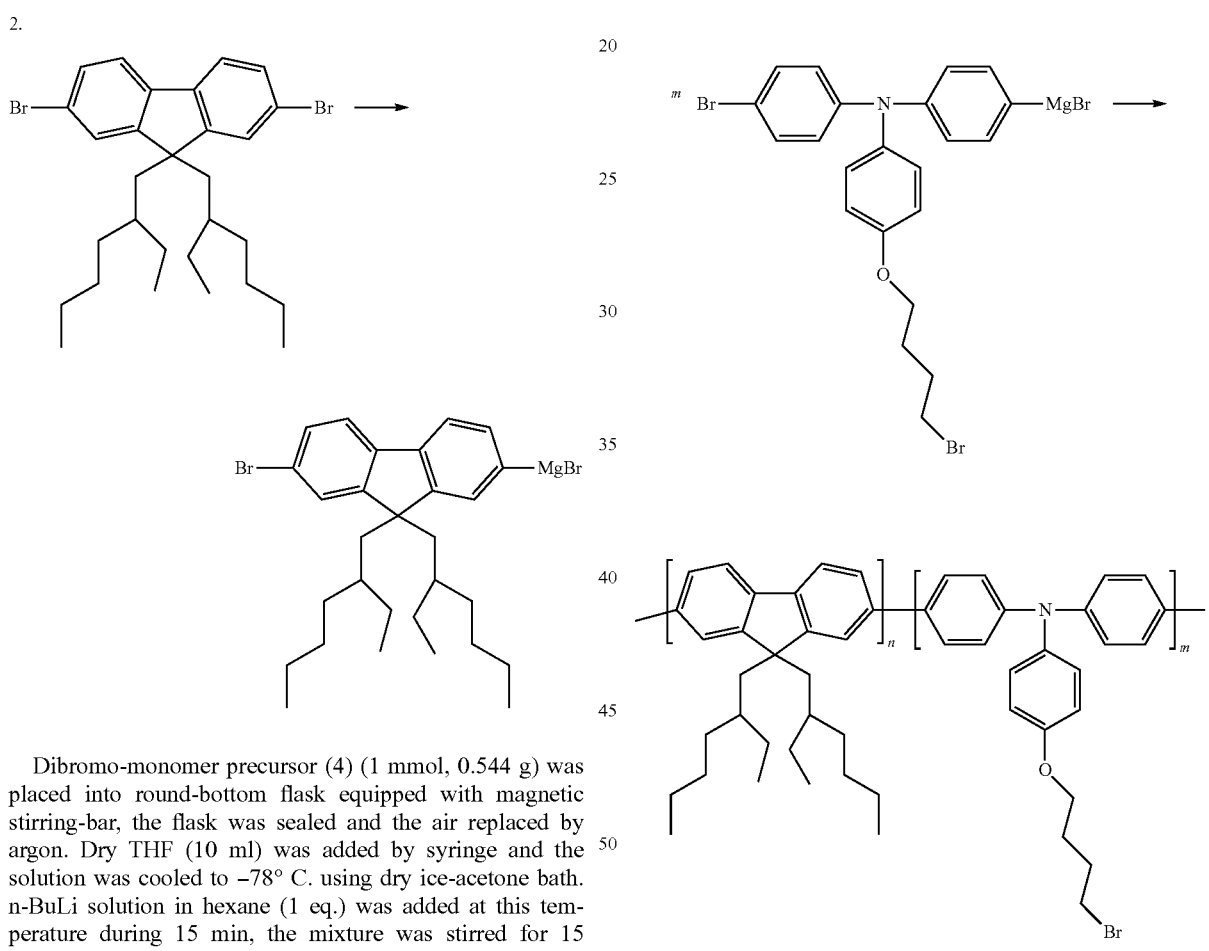

Dibromo-monomer precursor (4) (1 mmol, 0.544 g) was placed into round-bottom flask equipped with magnetic stirring-bar, the flask was sealed and the air replaced by argon. Dry THF (10 ml) was added by syringe and the solution was cooled to −78° C. using dry ice-acetone bath. n-BuLi solution in hexane (1 eq.) was added at this temperature during 15 min, the mixture was stirred for 15 minutes. An addition of MgBr$_2$ (1.1 mmol, 0.202 g) solution in 5 mL THF followed. The reaction mixture was allowed to reach room temperature over 30 min.

2,7-dibromo-9,9-bis(2-ethylhexyl)-9H-fluorene (1 mmol, 0.548 g) was placed into round-bottom flask equipped with magnetic stirring-bar, the flask was sealed and the air replaced by argon. Dry THF (10 ml) was added by syringe and the solution was cooled to −78° C. using dry ice-acetone bath. n-BuLi solution (1 eq.) was added at this temperature during 15 min, the mixture was stirred for 15 minute. An addition of MgBr$_2$ (1.1 mmol, 0.202 g) solution in THF followed. The reaction mixture was allowed to reach room temperature over 30 min.

b) Polymerization (Polymeric Intermediate PI1)

Prepared solutions were mixed together under argon and then catalyst suspension (typically 0.01 eq. of [1,3-Bis (diphenylphosphino)propane]dichloronickel(II) in THF) was added via septum by syringe. Polymerisation was allowed to proceed overnight at room temperature and terminated by addition of methanol. Crude polymer was obtained by precipitation in excess of methanol. Purification of the polymer was done by triple re-precipitation in methanol from a toluene solution.

Model Polymers

Poly[(9,9-di(2-ethylhex-1-yl)-9H-fluoren-2,7-diyl)-co-(4-4'-4"-(4-(butan-2-yl))-N,N-diphenylaniline)] (P2)

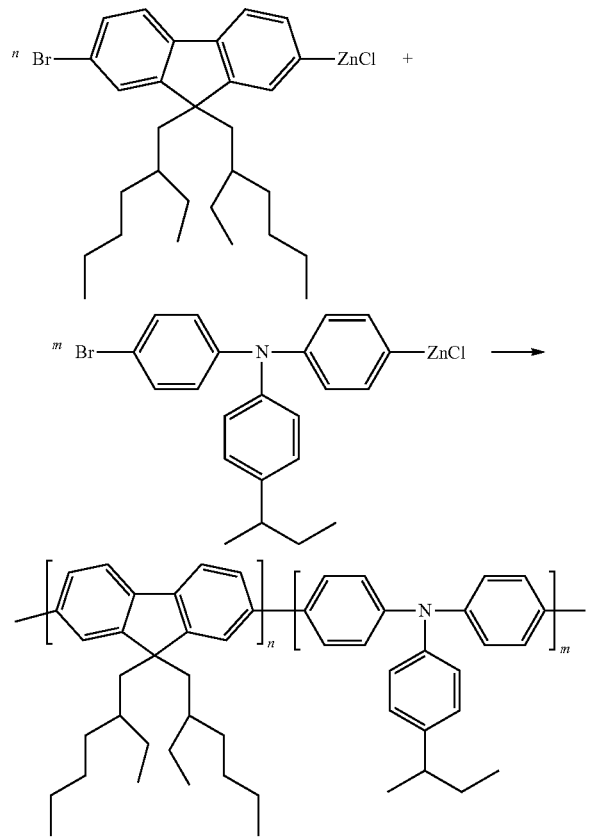

The polymer was prepared according to the previous general procedure for NCTP from 2.34 g (4.36 mmol) of dibromo-9,9-bis(2-ethylhexyl)-9H-fluorene and 2 g (4.36 mmol) 4-bromo-N-(4-bromophenyl)-N-[4-(butan-2-yl)phenyl]aniline.

Yield 2.71 g (90%) as a pale yellow solid.
$M_n$=18 800 PDI=3.45

Poly(9-(2-ethylhexyl)-9H-carbazole-3,6-diyl) (P3)

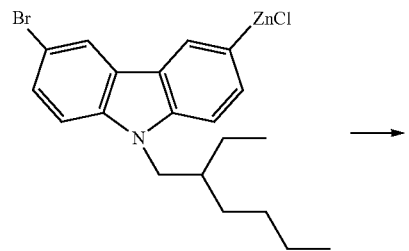

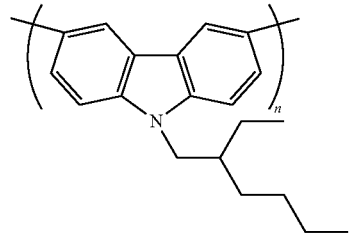

The polymer was prepared according to the previous general procedure for NCTP from 6.23 g (14.25 mmol) 3,6-dibromo-9-(2-ethylhexyl)-9H-carbazole.

Yield 3.6 g (80.8%) as a white solid.
$M_n$=6000; PDI=1.77

Functional Polymers

Poly[(9,9-di(2-ethylhex-1-yl)-9H-fluoren-2,7-diyl)-co-(4-4'-4"-(4-azidobutyl)-N,N-diphenylaniline)] (azide-containing polymer PP3)

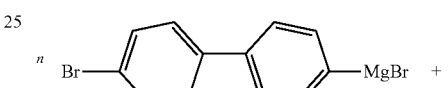

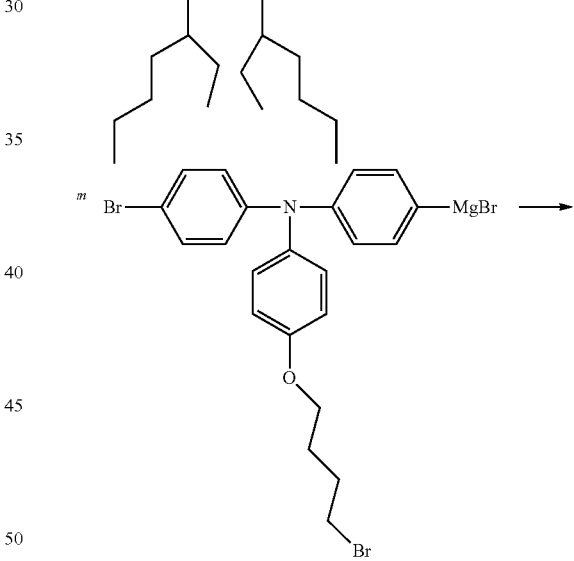

200 mg 4-bromobutyl-group bearing units containing polymer PI1, prepared according to the previous general KCTP procedure from 0.145 g 2,7-dibromo-9,9-bis(2-ethylhexyl)-9H-fluorene and 0.150 g 4-bromo-N-(4-bromophenyl)-N-(4-(4-bromobutoxy)phenyl)aniline (4) with [1,3-bis(diphenylphosphino)propane]dichloro-nickel(II) catalyst, were dissolved in 10 ml THF. Lithium azide (5 eq. based on alkyl-bromide groups in polymer, typically 25 mg) dissolved in 2 ml anhydrous DMF was added in one portion at room temperature. The solution was stirred at room temperature for 2 days, solids were filtered off and the filtrate poured into tenfold excess methanol. The precipitated crude polymer was separated by filtration and purified by re-precipitation from a toluene solution into methanol. The yield was almost quantitative.

$M_n$=15 239, PDI=2.09.

Poly[(9,9-di(2-ethylhex-1-yl)-9H-fluoren-2,7-diyl)-co-(4-4'-N,N-diphenyl-4''-hydroxyaniline)] (Hydroxy-Groups Containing Polymeric Intermediate PI3)

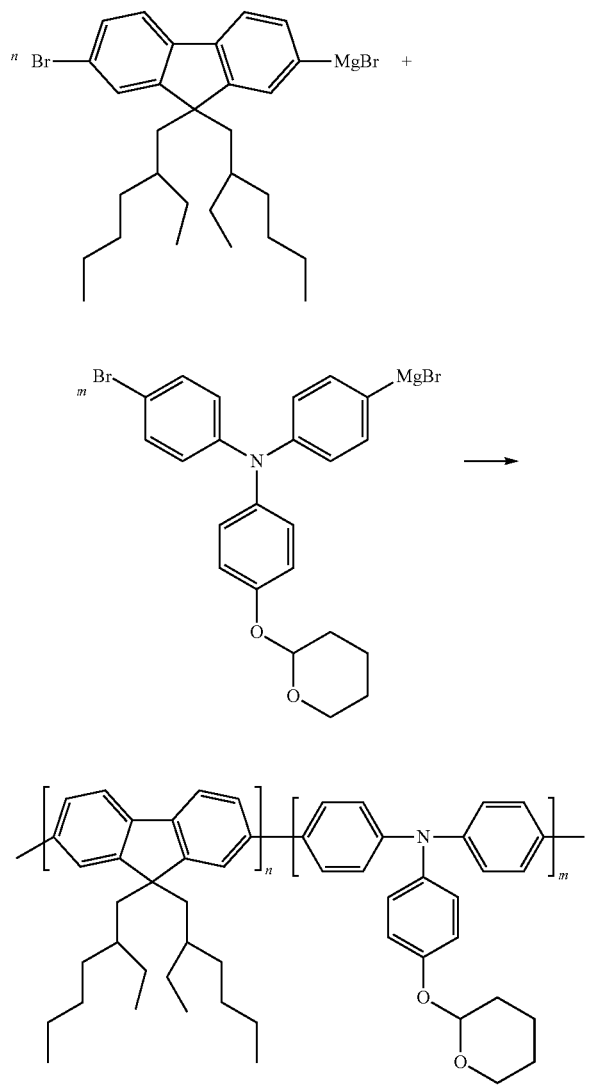

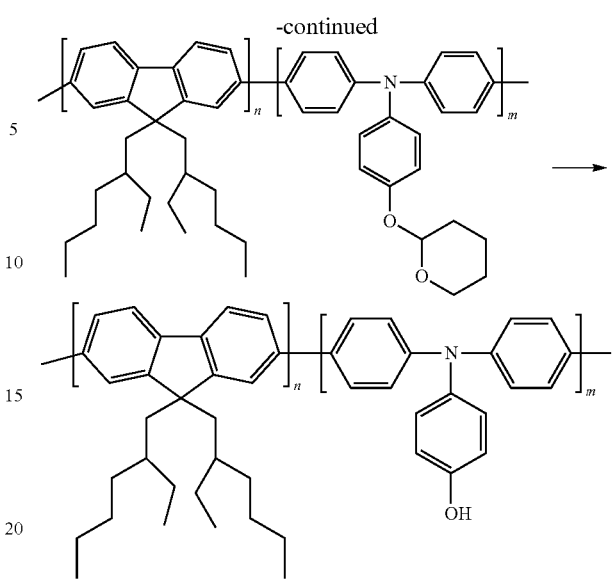

400 mg polymeric intermediate PI2, prepared according to the previous general KCTP procedure from 0.145 g 2,7-dibromo-9,9-bis(2-ethylhexyl)-9H-fluorene and from 0.145 g of 2-(4-(bis(4-bromophenyl)methyl)phenoxy)tetrahydro-2H-pyran, were dissolved in 40 ml dry THF. 3 mL dry methanol and 20 mg p-toluenesulfonic acid as a solution in 2 ml dry MeOH were added at room temperature. The reaction mixture was stirred at room temperature for 3 days and poured into methanol. The precipitated crude polymer was separated by filtration and purified by re-precipitation with methanol from a toluene solution.

$M_n$=14 059, PDI=1.77

Poly[(9,9-di(2-ethylhex-1-yl)-9H-fluoren-2,7-diyl)-co-(4-4'-4''-(prop-2-yn-1-yloxy)-N,N-diphenylaniline)] (alkyne-containing polymer PP4)

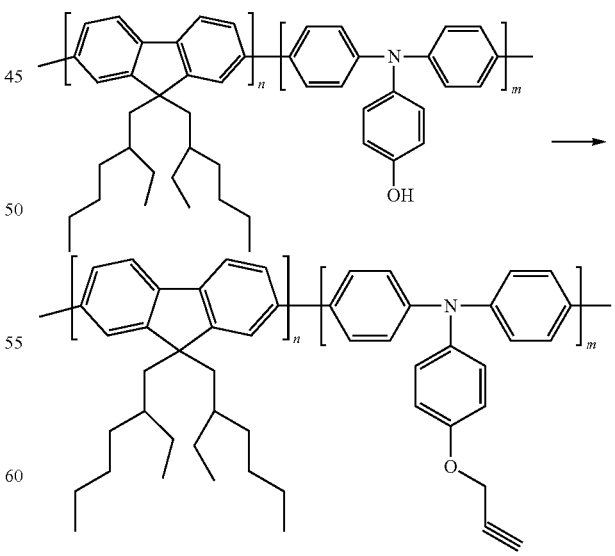

200 mg hydroxyl-groups containing polymeric intermediate PI3, obtained as described above, was dissolved in 10 ml anhydrous THF. Anhydrous potassium carbonate (70 mg, ~5 eq.) and a catalytic amount of 18-crown-6 were added and the mixture was heated to reflux for 1 h before propargyl bromide (149 mg, ~5 eq.) was added in one portion. The reaction mixture was heated at reflux overnight, then poured into water and extracted with toluene. The organic phase was washed with brine, dried over magnesium sulfate and filtered. The solution was concentrated and poured into tenfold excess of methanol. The precipitated crude polymer was separated by filtration and purified by re-precipitation with methanol from a toluene solution.

Poly(9-(2-ethylhexyl)-9H-carbazol-3,6-diyl-co-(9-(4-bromobutyl)-9H-carbazole-3,6-diyl)) (4-bromobutyl-groups containing polymeric intermediate PI4)

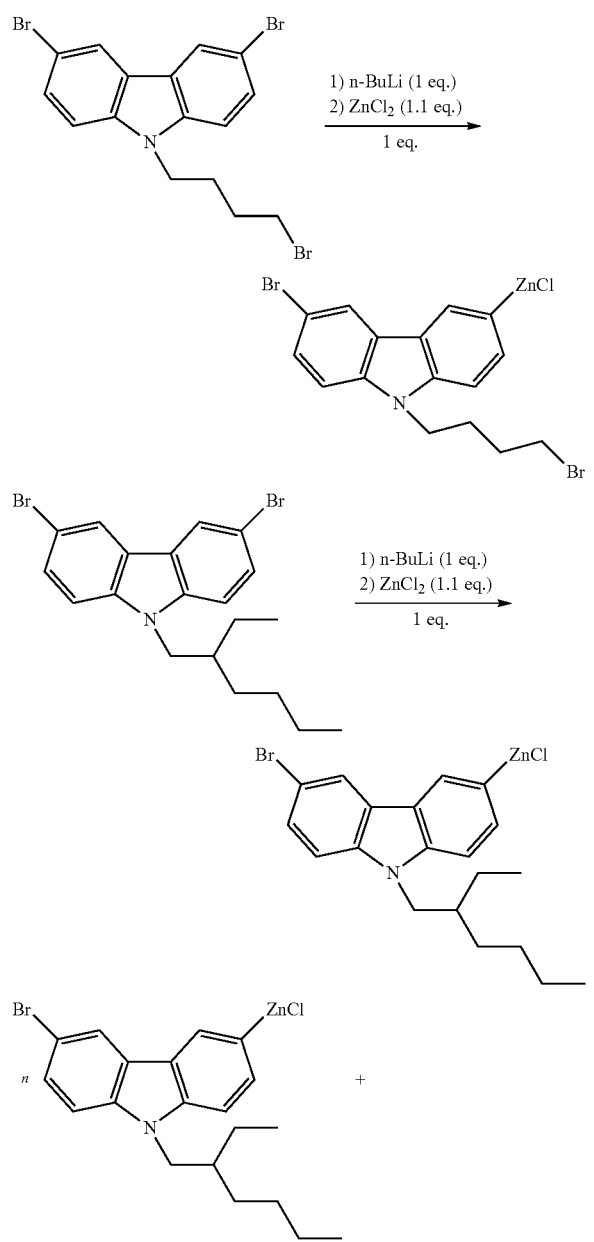

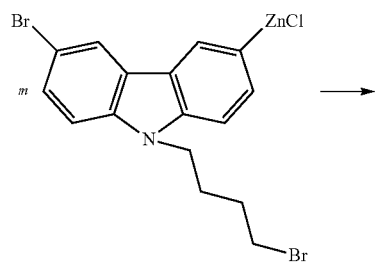

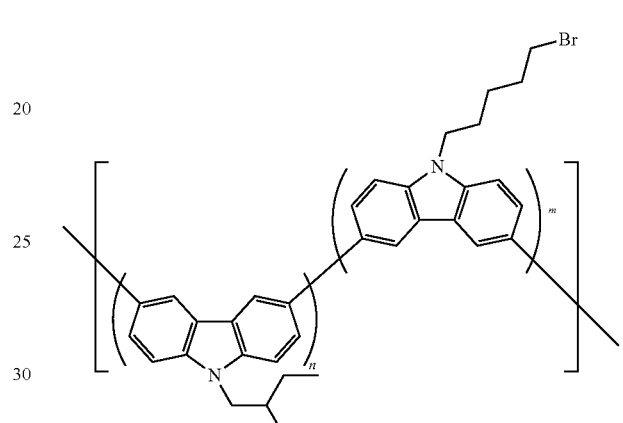

The polymer was prepared according to the previous general procedure for NCTP from 1.38 g (3 mmol) 3,6-dibromo-9-(4-bromobutyl)-9H-carbazole (7) and 1.31 g (3 mmol) 3,6-dibromo-9-(2-ethylhexyl)-9H-carbazole.

Yield 1.23 g (71%)

$M_n$=3000; PDI=1.43

Poly(9-(2-ethylhexyl)-9H-carbazole-3,6-diyl)-co-(9-(4-azidobutyl)-9H-carbazole-3,6-diyl)) (PP5)

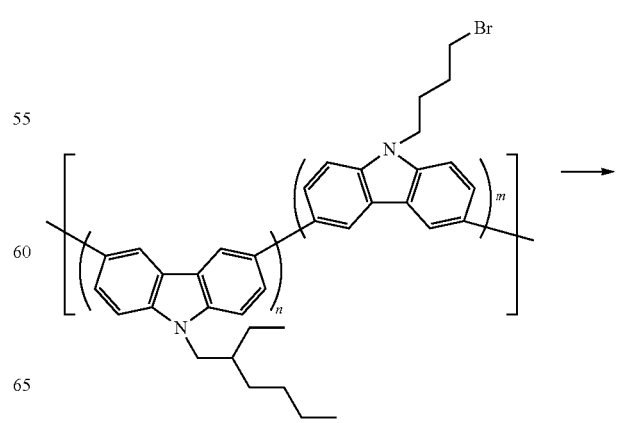

-continued

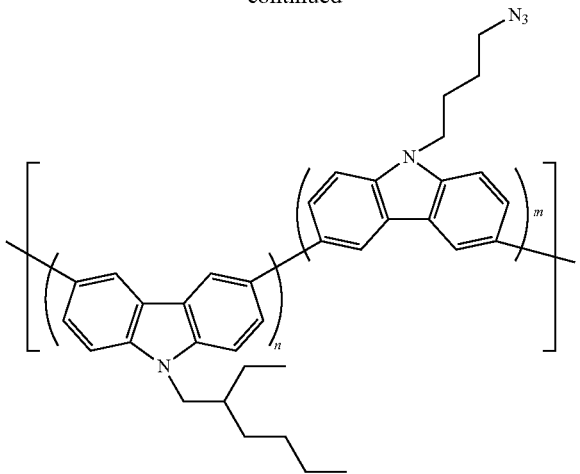

288.5 mg poly(N-(2-ethylhexyl)carbazol-3,6-diyl-co-(N-(4-bromobutyl)carbazol-3,6-diyl)) (PI4) were dissolved in 10 mL THF. 13 mg lithium azide (5 eq. based on alkyl-bromide groups in polymer) dissolved in 2 ml anhydrous DMF were added in one portion at room temperature. The solution was stirred at room temperature for 2 days, solids were filtered off and the filtrate poured into tenfold excess methanol. The precipitated polymer was separated by filtration and purified by re-precipitation from a toluene solution into methanol.

Yield 210 mg (78%)
$M_n$=3400; PDI=1.43

Poly(9-(2-ethylhexyl)-9H-carbazole-3,6-diyl)-co-(9-(prop-2-yn-1-yl)-9H-carbazole-3,6-diyl) (PP6)

1. (6-bromo-9-(trimethylsilyl)-9H-carbazol-3-yl)zinc(II) Chloride Solution

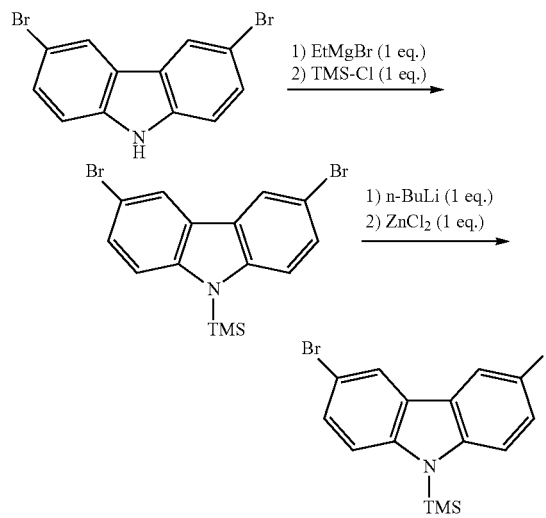

3,6-dibromo-9H-carbazole (0.975 g, 3 mmol) was placed into round-bottom flask equipped with magnetic stirring bar, the flask was sealed and the air replaced with argon. Dry THF (30 ml) was added by syringe followed by dropwise addition of ethylmagnesium bromide solution in diethyl ether (1 ml, 3 mmol). The mixture was stirred at room temperature until gas evolution ceased (approximately 20 minutes). 0.38 mL (3 mmol, 1 eq.) chlorotrimethylsilane was added dropwise and the resulting solution was stirred for an additional hour at room temperature and cooled down to −78° C. using dry ice-acetone bath. n-BuLi solution (1.2 ml, 2.5M in n-hexane, 3 mmol) was added at this temperature during 15 min, the mixture was stirred for 15 minute. An addition of ZnCl₂ (1.1 mmol, 0.202 g) solution in THF followed. The reaction was allowed to reach room temperature over 30 min.

2. Poly(9-(2-ethylhexyl)-9H-carbazole-3,6-diyl)-co-(9-(trimethoxysilyl)-9H-carbazole-3,6-diyl) (PI5)

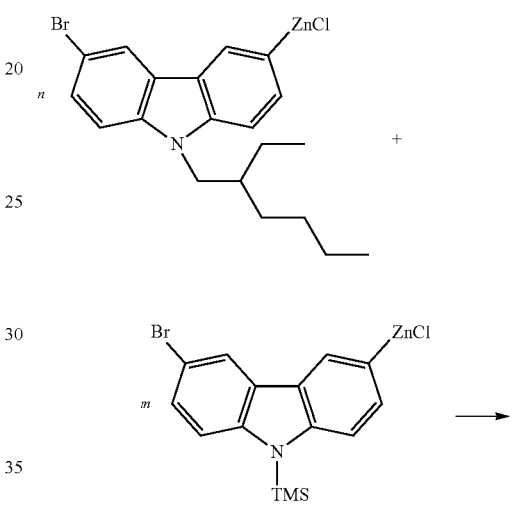

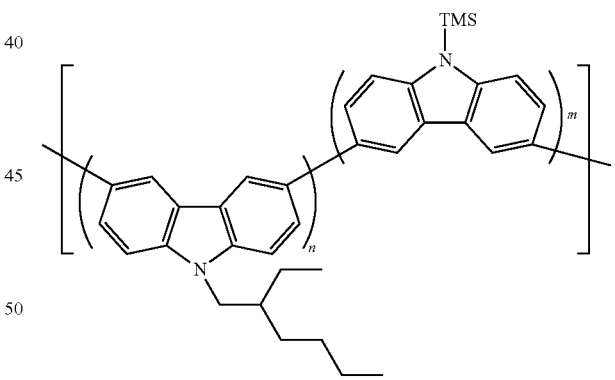

The solution of (6-bromo-9-(trimethylsilyl)-9H-carbazol-3-yl)zinc(II) chloride, prepared as described above, was mixed under argon with a monomer solution prepared according to the general procedure for NCTP polymerization from 1.31 g (3 mmol) 3,6-dibromo-9-(2-ethylhexyl)-9H-carbazole. Then, catalyst suspension (0.005 eq. PdCl₂P(tBu)₃ in THF) was added via septum by a syringe. The polymerization was allowed to proceed for 15 minutes at room temperature and terminated by methanol addition. The crude polymer was purified according to the procedure described above.

Yield 0.93 g (60%)

3. Poly(9-(2-ethylhexyl)-9H-carbazole-3,6-diyl)-co-(9-(prop-2-yn-1-yl)-9H-carbazole-3,6-diyl) (PP6)

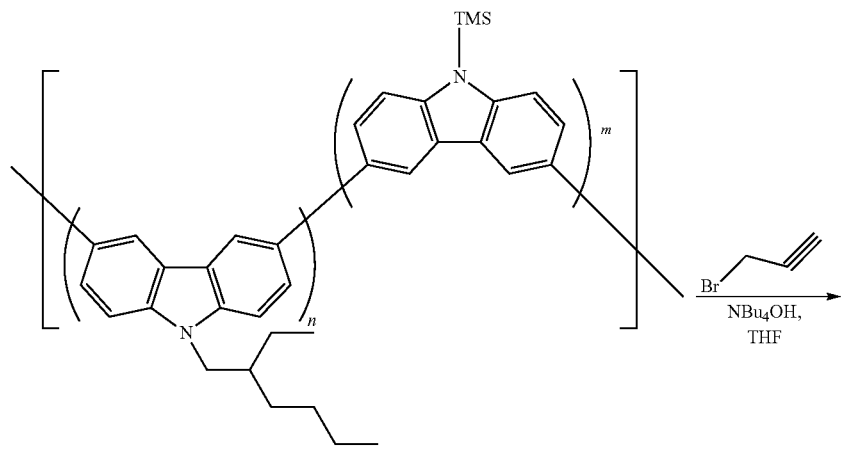

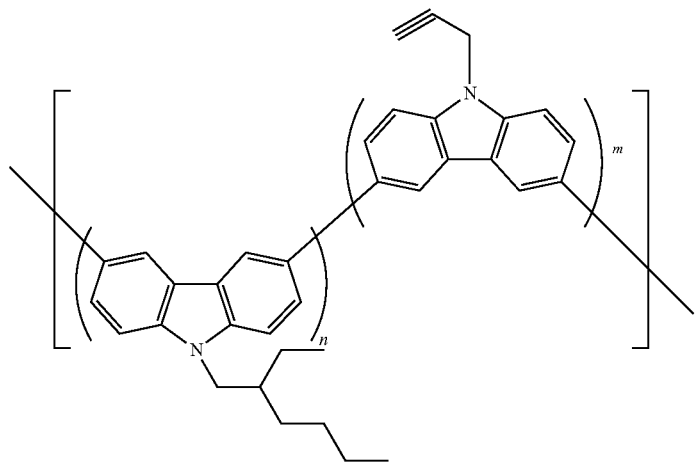

928 mg poly(9-hexyl-9H-carbazole-3,6-diyl)-co-(9-(trimethoxysilyl)-9H-carbazole-3,6-diyl) (PI5, ~3 mmol NH-groups based on 1H-NMR assay) were dissolved in 50 mL dry THF under argon atmosphere. 3 ml 80 wt. % propargyl bromide solution in toluene were added in one portion at room temperature. Then, tetrabutyl ammonium hydroxide (TBAH, 1.94 g, ~3 mmol) in methanolic solution was added with such a rate, that the next droplet of the solution is added after consumption of the previous one (as judged by bleaching of orange-red color of the solution appearing immediately after each base addition). The hydroxide addition was completed after ~4 hours, the mixture was stirred for an additional hour, filtered through a 200 nm syringe membrane filter, concentrated to about 15 mL and poured into a tenfold excess methanol. The polymer was obtained as a white solid after filtration and drying in vacuum at room temperature.

Poly((9-(2-ethylhexyl)-9H-carbazole-3,6-diyl)-co-(9,9-bis(3-(triisopropylsilyl)-prop-2-yn-1-yl)-9H-fluorene-2,7-diyl) (PP7)

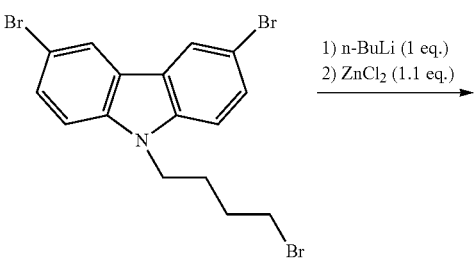

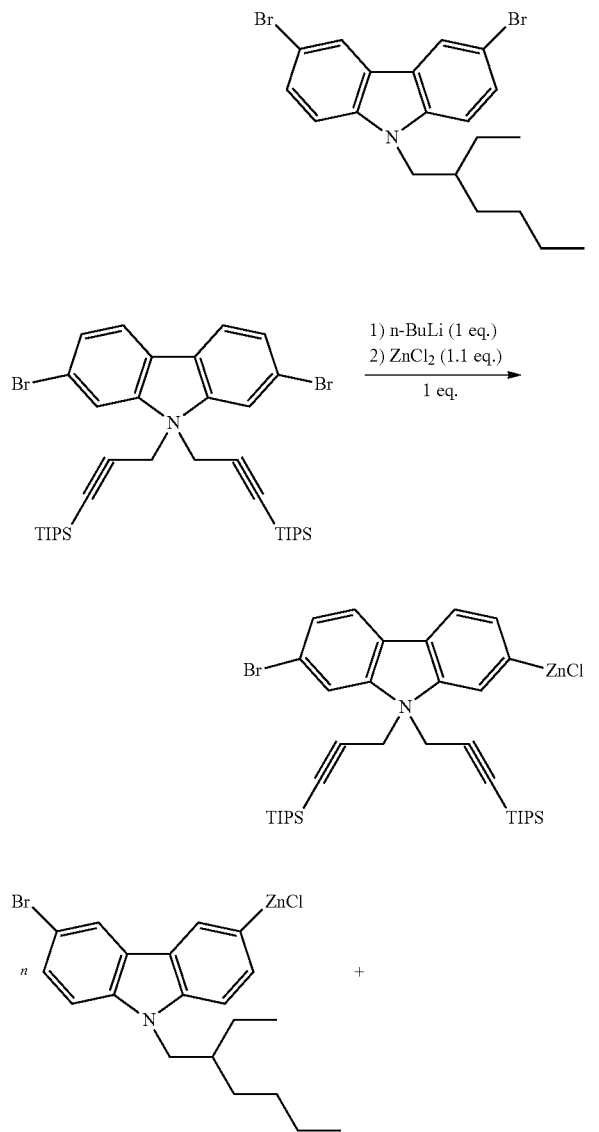
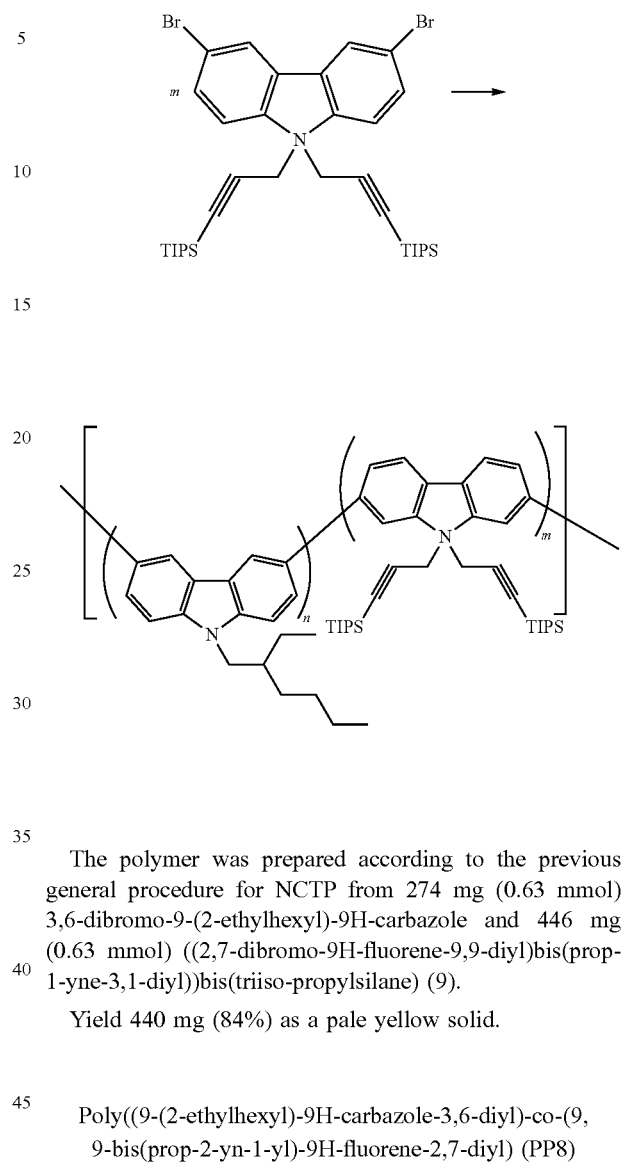
The polymer was prepared according to the previous general procedure for NCTP from 274 mg (0.63 mmol) 3,6-dibromo-9-(2-ethylhexyl)-9H-carbazole and 446 mg (0.63 mmol) ((2,7-dibromo-9H-fluorene-9,9-diyl)bis(prop-1-yne-3,1-diyl))bis(triiso-propylsilane) (9).
Yield 440 mg (84%) as a pale yellow solid.
Poly((9-(2-ethylhexyl)-9H-carbazole-3,6-diyl)-co-(9,9-bis(prop-2-yn-1-yl)-9H-fluorene-2,7-diyl) (PP8)
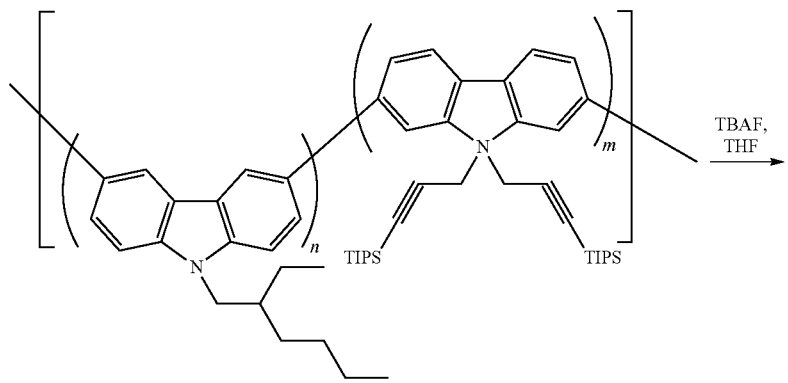

-continued

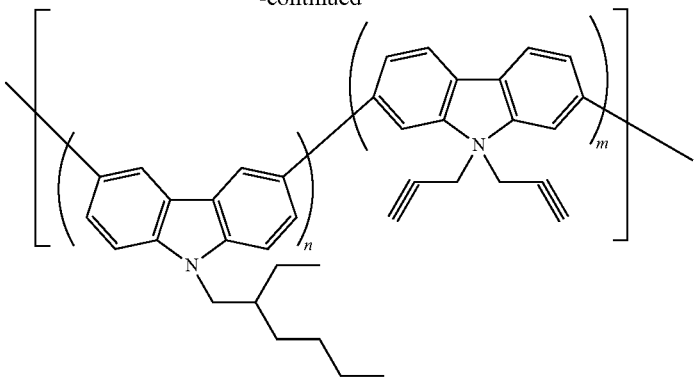

A 25-mL, single-necked, round-bottomed flask, fitted with a stirring bar, was charged with poly((9-(2-ethylhexyl)-9H-carbazole-3,6-diyl)-co-(9,9-bis(3-(triisopropylsilyl)-prop-2-yn-1-yl)-9H-fluorene-2,7-diyl) (440 mg) and sealed with a rubber septum. 10 mL anhydrous THF were added through the septum via syringe and the mixture was stirred at a room temperature until a homogeneous solution was obtained. 1.2 ml 1M tetrabutylammonium fluoride (TBAF, solution in THF) were added to the polymer solution via syringe and the resulting mixture was stirred at RT overnight.

The polymer was obtained by precipitation of the solution into a tenfold excess methanol, filtration and drying in vacuum at room temperature.

Yield 250 mg (76%)

$M_n$=6000, PDI=8.05

Conductivity and Stability of a Doped Crosslinked Layer

An anisole solution containing 1.74% polymeric precursor PP3, 0.09% p-dopant PR-1 and 0.17% small-molecule crosslinker SC1 was prepared and spin-coated on ITO substrate for 30 s at 1000 rpm. The conductivity and thickness of the film after baking on hot plate in nitrogen atmosphere for 0, 3, 15 and 30 min were measured.

The formed films were spin-rinsed with toluene after 10 s soaking-time before spinning After 30 min drying at 80° C., the thickness and conductivity were measured again.

Red OLED

On 90 nm thick indium tin oxide (ITO) layer fabricated on a glass substrate, 50 nm thick crosslinked hole-transporting layer from PP3 and SC1 doped with PR1 was cast by spin-coating from 2 wt. % toluene solution (weight ratio of components as above). After drying and baking in an inert atmosphere at 120° C. for 30 minutes, a doped crosslinked layer having thickness 50 nm was obtained. Following layers were prepared on top of the crosslinked layer by vacuum deposition: 10 nm undoped electron blocking layer composed from N4, N4, N4", N4"-tetra([1,1'-biphenyl]-4-yl)-[1,1':4,4'-terphenyl]-4,4"-diamine, 40 nm emitting layer composed from 3,9-di(naphtalen-2-yl)perylene and 3,10-di(naphtalen-2-yl)perylene mixture (DNP), aluminium quinolate (Alq$_3$) and 4-dicyanomethylene-2-tert-butyl-6-(1,1,7,7-tetramethyljulolidin-4-yl-vinyl)-4H-pyrane (DCJTB) in weight ration 70:29:1, 10 nm hole blocking layer from 4-(naphtalen-1-yl)-2,7,9-triphenylpyrido[3,2-h]quinazoline, 10 nm electron transporting layer from 4-(naphtalen-1-yl)-2,7,9-triphenylpyrido[3,2-h]quinazoline and tetrakis(1,3,4,6,7,8-hexahydro-2H-pyrimido[1,2-a]pyrimidinato)ditungsten (II) (W(hpp)$_4$) in the weight ratio 9:1, and 100 nm thick Al cathode. The OLED had maximum intensity at 630 nm, quantum efficiency 7.2%, current efficiency 10.9 cd/A and power efficiency 13.6 lm/W at 10 mA/cm$^2$ (see also FIGS. 7 and 8).

Blue OLED

On 90 nm thick indium tin oxide (ITO) layer fabricated on a glass substrate, 50 nm thick crosslinked hole-transporting layer from PP5 and PP9 (poly(9-butyl-9H-carbazole-3,6-diyl)-co-(9-(prop-2-yn-1-yl)-9H-carbazole-3,6-diyl, ratio of butyl and propargyl units 19:1, prepared analogously to PP6) doped with 20 wt. % PR1 based on the overall polymer weight was cast by spin-coating from 2 wt. % toluene-anisole solution. After drying and baking in an inert atmosphere at 120° C. for 120 minutes, a doped crosslinked layer having thickness 40 nm was obtained. Following layers were prepared on top of the crosslinked layer by vacuum deposition: 90 nm undoped electron blocking layer composed from N4,N4"-di(naphtalen-1-yl)-N4,N4"-diphenyl-[1,1':4,4'-terphenyl]-4,4"-diamine, 20 nm blue fluorescent emitting layer composed of ABH113 (obtained from Sun Fine Chem (SFC), Korea) doped with NUBD370 (also from SFC, host:emitter ratio 95:5 by weight), 30 nm electron transporting layer composed of 2-(4-(9,10-di(naphtalen-2-yl)anthracen-2-yl)phenyl)-1-phenyl-1H-benzo[d]imidazole (CAS 561064-11-7) and lithium 8-hydroxyquinolinolate (CAS 850918-68-2) in weight ratio 1:1 and 100 nm thick Al cathode. The OLED had voltage 5.0 V, quantum efficiency 5.9%, current efficiency 5.5 cd/A and power efficiency 3.4 lm/W at 15 mA/cm$^2$ (see also FIGS. 9 and 10). The lifetime of the OLED, expressed as LT97 (the time necessary for luminance decrease to 97% of its initial value), was 53 hours.

Example J

Jet Printing

A jet-printed pattern was created using as ink the anisole solution PP3 and SC1 with PR1 in the same ratio as above and jet printer PiXDRO LP50. FIG. 9 shows a blue "hybrid" OLEDs with ink jet printed crosslinked p-HTL, a) OLED test layout, b) pixel, ink jet printing not optimized, c) pixel at optimum ink jet printing with 1% concentration of the polymer by weight, resolution 300 dpi and 400 mm/s printing speed.

Results

FIG. 5a-5e show the conductivities of layers comprising PP1a and SC1 resp. PP3 and SC1 and different dopants during heating to 120° C. for 3 to 20 minutes. It is shown that the conductivity of crosslinked layers remains in the range sufficient for practical applicability and mostly is practically independent on crosslinking FIG. 6a-6e show thickness of the crosslinked layers doped with different dopants before and after rinsing with toluene. The measured thickness of the layers remains constant within the range of experimental errors. The resistance of the layers against toluene, which is a good solvent for non-crosslinked materials, shows successful crosslinking of the prepared layers.

The conductivity of $10^{-6}$-$10^{-5}$ S/cm, as required for a hole transporting layer, was maintained in the doped layer after crosslinking. If the dopant was destroyed during the cycloaddition reaction, a significant lower conductivity of about $10^{-10}$ S/cm would be obtained.

Accordingly, there is clear evidence that the inventive charge transporting semi-conducting material as well as the inventive process provide the possibility to build crosslinked charge transporting layers from solution under mild conditions.

Further evidence to successful crosslinking is given by the ATR-IR spectra shown in FIG. 4.

Spectrum 1 (full line), corresponding to the polymer before crosslinking, features a pronounced absorption band at 2.096 cm$^{-1}$ which is characteristic to the azide group $N_3$.

Spectrum 2 (dashed line), corresponding to the polymer after cross-linking, features a significant decrease of this band.

The red and blue OLEDs demonstrate that a crosslinked charge transporting layer comprising semiconducting material according to the invention can be successfully used in organic electronic devices.

The jet-printing example J shows that the invention enables preparation of organic electronic devices like OLEDs by printing techniques.

The features disclosed in the foregoing description and in the claims may, both separately and in any combination thereof, be material for realizing the invention in diverse forms thereof.

The invention claimed is:

1. A charge transporting semi-conducting material comprising:
    a cross-linked charge-transporting polymer comprising 1,2,3-triazole cross-linking units of the general formulae Ia and/or Ib,

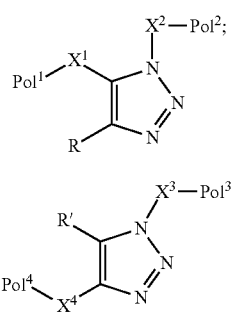

wherein
    aa) $Pol^1$-$Pol^4$ are independently selected from charge-transporting polymers,
    bb) $X^1, X^2, X^3$, and $X^4$ are independently selected from spacer units having up to 30 multivalent atoms or represent direct bonding of $Pol^1$-$Pol^4$ to the 1,2,3-triazole ring, and
    cc) R and R' are independently selected from the group consisting of
    H, halogen, nitrile, $C_1$-$C_{22}$ saturated or unsaturated alkyl, $C_3$-$C_{22}$ cycloalkyl, $C_6$-$C_{18}$ aryl, $C_7$-$C_{22}$ arylalkyl,
    $C_2$-$C_{13}$ heteroaryl having up to three heteroatoms independently selected from oxygen, nitrogen, or sulphur,
    $SiR^1R^2R^3$, wherein $R^1$, $R^2$, and $R^3$ are independently selected from $C_1$-$C_4$ alkyl or phenyl, $COR^4$ or $COOR^5$, wherein $R^4$ and $R^5$ are independently selected from $C_1$-$C_{22}$ alkyl or $C_7$-$C_{22}$ arylalkyl, and
    $CR^6R^7OR^8$, wherein $R^6$ and $R^7$ are independently selected from H, $C_1$-$C_6$ alkyl, $C_6$-$C_9$ aryl, or $R^6$ and $R^7$ together form a $C_3$-$C_7$ ring, and $R^8$ is $C_1$-$C_6$ alkyl, $C_7$-$C_{22}$ arylalkyl, $SiR^9R^{10}R^{11}$, wherein $R^9$, $R^{10}$, and $R^{11}$ are independently selected from $C_1$-$C_4$ alkyl or phenyl, or $COR^{12}$, wherein $R^{12}$ is H or $C_1$-$C_{21}$ alkyl; and
wherein
    (i) the cross-linked charge-transporting polymer is a continuous infinite network,
    (ii) the charge-transporting polymer is capable of transporting an injected charge due to a system of overlapping orbitals along the charge-transporting polymer, and
    (iii) the injected charge is an electron injected or withdrawn either by an electrode arranged in contact with the charge-transporting polymer and/or through a reaction with a dopant capable of increasing the conductivity of the charge-transporting polymer.

2. A charge transporting semi-conducting material according to claim 1, further comprising an electrical dopant, wherein the electrical dopant is selected from a [3]-radialene compound, wherein each of the three carbon atoms connected to a cyclopropyl moiety of the [3]-radialene compound by a double bond is substituted independently with at least one of a nitrile group, $C_6$-$C_{14}$ perfluorinated aryl, or $C_2$-$C_{14}$ perfluorinated heteroaryl.

3. The charge transporting semi-conducting material according to claim 2, wherein one to three fluorine atoms in the perfluorinated substituents are replaced by groups independently selected from nitrile or trifluoromethyl.

4. The charge transporting semi-conducting material according to claim 1, wherein the groups from which R and R' are selected comprise at least one substituent selected from alkyl, cycloalkyl, aryl, heteroaryl, or arylalkyl.

5. The charge transporting semi-conducting material according to claim 4, wherein when at least one of R and R' comprises the substituent selected from alkyl, cycloalkyl, aryl, heteroaryl, or arylalkyl, the alkyl, cycloalkyl, aryl, heteroaryl, or arylalkyl is partially or fully substituted with halogen atoms.

6. A method for preparing the charge transporting semi-conducting material according to claim 1, the method comprising:
    i) providing a solution containing
        a) a first precursor charge transporting polymer comprising at least one covalently attached azide group;

and/or a second precursor charge transporting polymer comprising at least one covalently attached acetylenic group,
   b) at least one solvent,
ii) depositing the solution on a substrate,
iii) removing the solvent, and
iv) reacting the azide and acetylenic groups to effect crosslinking.

7. The method according to claim 6, wherein the first precursor charge transporting polymer further comprises at least one acetylenic group, and/or the second precursor charge transporting polymer comprises at least one azide group.

8. The method according to claim 6, wherein the solution further comprises at least one crosslinking agent comprising at least two functional groups selected from an azide and/or an acetylenic group.

9. A semiconducting device comprising a semi-conducting layer comprising a charge transporting semi-conducting material according to claim 1.

10. The device of claim 9, wherein the semiconducting layer is made by a printing process.

\* \* \* \* \*